United States Patent
Toriyama et al.

(10) Patent No.: US 9,691,978 B2
(45) Date of Patent: Jun. 27, 2017

(54) SEMICONDUCTOR MEMORY DEVICE AND METHOD OF CONTROLLING THE SAME

(71) Applicant: Kabushiki Kaisha Toshiba, Minato-ku (JP)

(72) Inventors: Shuichi Toriyama, Yokohama (JP); Reika Ichihara, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/941,946

(22) Filed: Nov. 16, 2015

(65) Prior Publication Data
US 2016/0163981 A1    Jun. 9, 2016

(30) Foreign Application Priority Data
Dec. 9, 2014    (JP) ................. 2014-249236

(51) Int. Cl.
*G11C 11/00* (2006.01)
*H01L 45/00* (2006.01)
(Continued)

(52) U.S. Cl.
CPC ........ *H01L 45/145* (2013.01); *G11C 13/0007* (2013.01); *G11C 13/0023* (2013.01);
(Continued)

(58) Field of Classification Search
CPC ... H01L 45/145; H01L 45/08; H01L 45/1226; G11C 13/0007; G11C 13/0023; G11C 13/0026
(Continued)

(56) References Cited

U.S. PATENT DOCUMENTS 6,147,901 A    11/2000  Sakata et al.
6,925,002 B2*  8/2005   Schwarzl ............... G11C 11/16
                                                  365/157
(Continued)

FOREIGN PATENT DOCUMENTS

JP    11-274421      10/1999
JP    2004-103888    4/2004
(Continued)

OTHER PUBLICATIONS

J. Robertson "High Dielectric Constant Oxides", The European Physical Journal Applied Physics, vol. 28, 2004, 27 pages.
(Continued)

*Primary Examiner* — Viet Q Nguyen
(74) *Attorney, Agent, or Firm* — Oblon, McClelland, Maier & Neustadt, L.L.P.

(57) ABSTRACT

According to one embodiment, a semiconductor memory device includes a plurality of first wirings, a plurality of second wirings, a variable resistance layer, a first barrier insulating layer, and a second barrier insulating layer. The first wirings are disposed at predetermined pitches in a first direction intersecting with a substrate. The second wirings are disposed at predetermined pitches in a second direction intersecting with the first direction. The second wirings are formed to extend in the first direction. The variable resistance layer is disposed between the first wiring and the second wiring. The variable resistance layer is disposed at a position where the first wiring intersects with the second wiring. The first barrier insulating layer is disposed between the first wiring and the variable resistance layer. The second barrier insulating layer is disposed between the second wiring and the variable resistance layer.

17 Claims, 15 Drawing Sheets

(51) Int. Cl.
*G11C 13/00* (2006.01)
*H01L 27/24* (2006.01)

(52) U.S. Cl.
CPC ........ *G11C 13/0026* (2013.01); *H01L 27/249* (2013.01); *H01L 27/2454* (2013.01); *H01L 45/08* (2013.01); *H01L 45/1226* (2013.01); *H01L 45/146* (2013.01); *H01L 45/147* (2013.01); *G11C 2213/15* (2013.01); *G11C 2213/71* (2013.01)

(58) Field of Classification Search
USPC .................................................. 365/148, 151
See application file for complete search history.

(56) References Cited

U.S. PATENT DOCUMENTS

| | | | | |
|---|---|---|---|---|
| 7,142,447 | B2 * | 11/2006 | Ueda | G11C 11/16 365/158 |
| 7,910,914 | B2 | 3/2011 | Tanaka et al. | |
| 8,331,136 | B2 * | 12/2012 | Ohmori | G11C 11/16 365/158 |
| 8,369,129 | B2 * | 2/2013 | Fujita | G11C 11/16 365/148 |
| 8,559,216 | B2 * | 10/2013 | Yasuda | H01L 27/101 257/288 |
| 8,575,590 | B2 * | 11/2013 | Muraoka | G11C 13/0004 257/2 |
| 8,829,482 | B1 * | 9/2014 | Gallo | H01L 45/085 257/133 |
| 8,891,277 | B2 | 11/2014 | Murooka | |
| 8,901,527 | B2 * | 12/2014 | Hsieh | H01L 45/08 257/2 |
| 8,916,846 | B2 | 12/2014 | Kobayashi et al. | |
| 8,969,843 | B2 * | 3/2015 | Ohba | H01L 45/12 257/2 |
| 9,178,023 | B2 * | 11/2015 | Hwang | H01L 29/8615 |
| 9,246,091 | B1 * | 1/2016 | Wang | H01L 45/1253 |
| 9,312,479 | B2 * | 4/2016 | Kim | H01L 45/06 |
| 2010/0213550 | A1 * | 8/2010 | Kanno | H01L 27/101 257/379 |
| 2011/0018100 | A1 * | 1/2011 | Nakagawa | H01L 21/02178 257/532 |
| 2012/0068137 | A1 * | 3/2012 | Hwang | H01L 27/2418 257/2 |
| 2012/0155165 | A1 | 6/2012 | Bimberg et al. | |
| 2013/0037777 | A1 * | 2/2013 | Mikawa | H01L 21/76807 257/4 |
| 2013/0112935 | A1 * | 5/2013 | Himeno | H01L 45/1253 257/4 |
| 2013/0140515 | A1 * | 6/2013 | Kawashima | H01L 45/085 257/4 |
| 2014/0061578 | A1 | 3/2014 | Kobayashi et al. | |

FOREIGN PATENT DOCUMENTS

| | | |
|---|---|---|
| JP | 2008-177291 | 7/2008 |
| JP | 2008-181978 | 8/2008 |
| JP | 2013-120618 | 6/2013 |
| JP | 2014-49749 | 3/2014 |
| JP | 2014-506002 | 3/2014 |

OTHER PUBLICATIONS

Ximeng Guan et al. "On the Switching Parameter Variation of Metal-Oxide RRAM—Part I: Physical Modeling and Simulation Methodology", IEEE Transactions on Electron Devices, vol. 59, No. 4, Apr. 2012, 11 pages.

Shimeng Yu et al. "Understanding Metal Oxide RRAM Current Overshoot and Reliability Using Kinetic Monte Carlo Simulation", Electron Devices Meeting (IEDM), 2012 IEEE International, 2012, 4 pages.

* cited by examiner

SEMICONDUCTOR MEMORY DEVICE AND METHOD OF CONTROLLING THE SAME

CROSS-REFERENCE TO RELATED APPLICATIONS

This application is based upon and claims the benefit of Japanese Patent Application No. 2014-249236, filed on Dec. 9, 2014, the entire contents of which are incorporated herein by reference.

FIELD

Embodiments described herein relate generally to a semiconductor memory device and a method of controlling the same.

BACKGROUND

Recently, there has been proposed a Resistive RAM (ReRAM) that uses variable resistive elements, which reversibly change a resistance value, as a memory. This ReRAM includes the variable resistive element between a sidewall of a word line extending parallel to a substrate and a sidewall of a bit line extending perpendicular to the substrate. This structure ensures further highly integrated memory cell array. With the memory cell array with such structure, a selection gate transistor is coupled to a lower end of the bit line. This selection gate transistor selectively couples each of the bit lines to a global bit line.

DETAILED DESCRIPTION

A semiconductor memory device according to one embodiment of the present invention includes a plurality of first wirings, a plurality of second wirings, a variable resistance layer, a first barrier insulating layer, and a second barrier insulating layer. The first wirings are disposed at predetermined pitches in a first direction intersecting with a substrate. The second wirings are disposed at predetermined pitches in a second direction intersecting with the first direction. The second wirings are formed to extend in the first direction. The variable resistance layer is disposed between the first wiring and the second wiring. The variable resistance layer is disposed at a position where the first wiring intersects with the second wiring. The first barrier insulating layer is disposed between the first wiring and the variable resistance layer. The second barrier insulating layer is disposed between the second wiring and the variable resistance layer.

[First Embodiment]
[Configuration]

Figure 1:
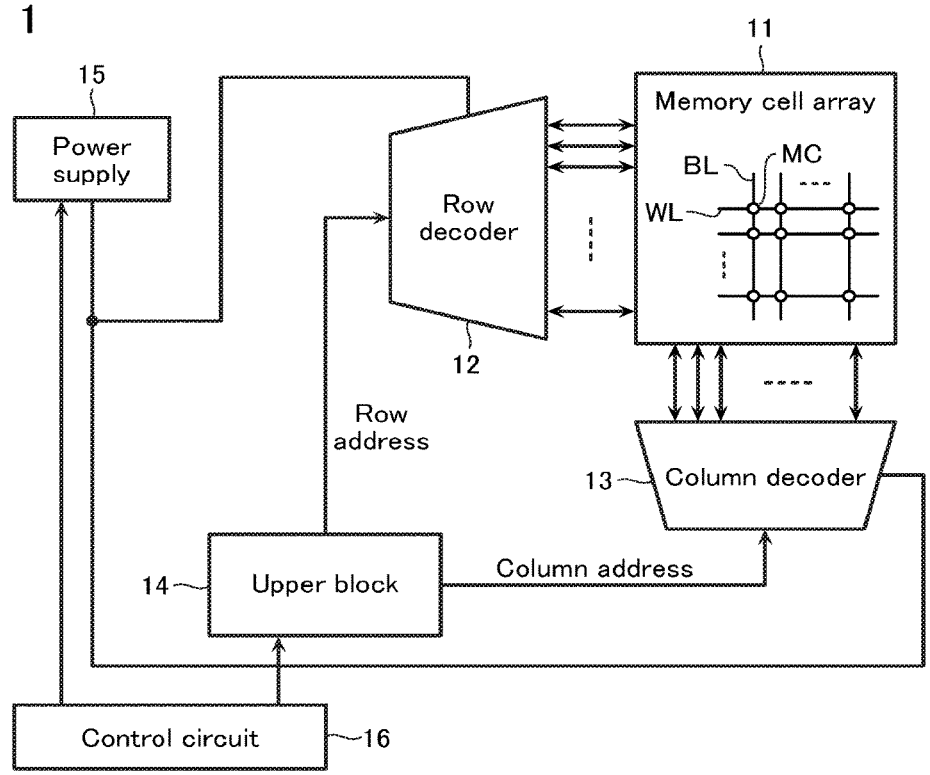
FIG. 1 is an exemplary block diagram of a semiconductor memory device according to a first embodiment.

First, the following describes an overall configuration of a semiconductor memory device according to the first embodiment. FIG. 1 is an exemplary block diagram of the semiconductor memory device according to the first embodiment. As illustrated in FIG. 1, the semiconductor memory device includes a memory cell array 11, a row decoder 12, a column decoder 13, an upper block 14, a power supply 15, and a control circuit 16.

The memory cell array 11 includes a plurality of word lines WL and bit lines BL, which intersect with one another, and memory cells MC, which are disposed in the respective intersecting portions of these lines. The row decoder 12 selects the word line WL for access (data deletion/writing/reading). The column decoder 13 includes a driver that selects the bit line BL for access to control an access operation.

The upper block 14 selects the memory cell MC in the memory cell array 11 to be accessed. The upper block 14 gives a row address and a column address to the row decoder 12 and the column decoder 13, respectively. The power supply 15 generates combinations of predetermined voltages corresponding to the respective operations of data deletion/writing/reading and supplies the combinations to the row decoder 12 and the column decoder 13. The control circuit 16 performs a control such as transmission of an address to the upper block 14 in response to an external command and controls the power supply 15.

Figure 2:
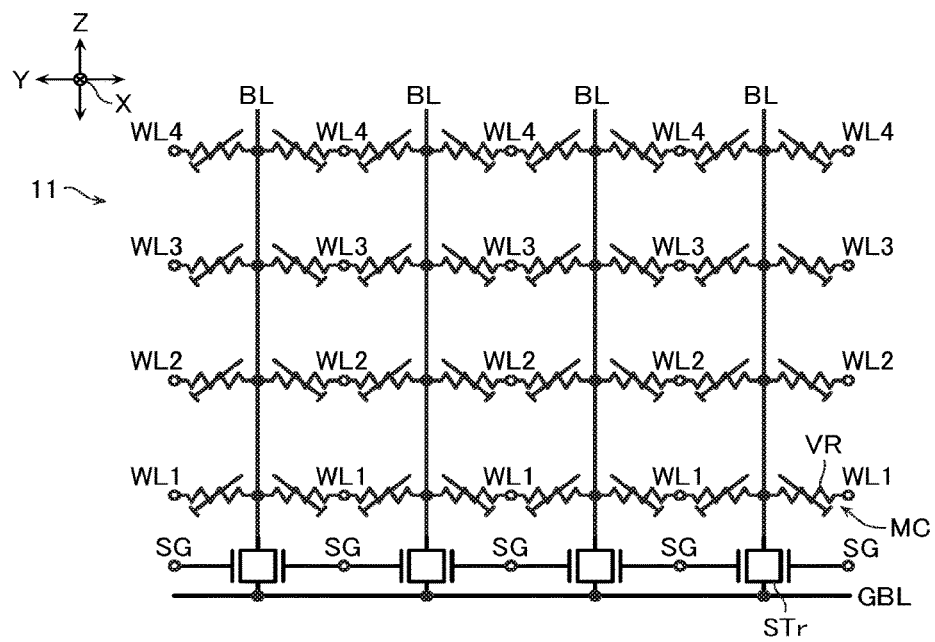
FIG. 2 is an exemplary circuit diagram of a memory cell array 11 of the semiconductor memory device.
Figure 3:
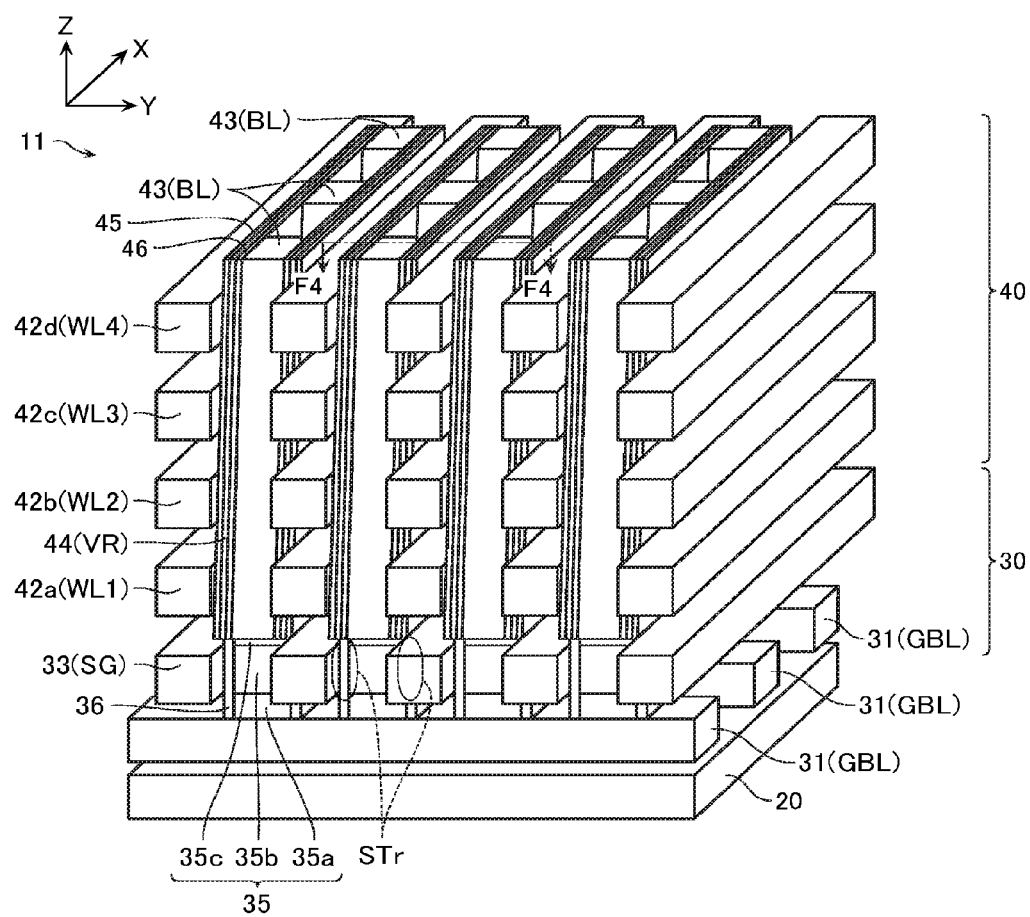
FIG. 3 is an exemplary perspective view illustrating a laminated structure of the memory cell array 11.

The following describes the memory cell array 11 according to the first embodiment in detail with reference to FIG. 2 and FIG. 3. FIG. 2 is an exemplary circuit diagram of the memory cell array 11. FIG. 3 is an exemplary perspective view illustrating the laminated structure of the memory cell array 11. In FIG. 2, the X direction, the Y direction, and the Z direction are mutually orthogonal. The X direction is a direction the perpendicular to the paper. The structures illustrated in FIG. 2 are continuously disposed in the X direction.

As illustrated in FIG. 2, the memory cell array 11 includes selection transistors STr, global bit lines GBL, and a selection gate line SG in addition to the above-described word lines WL, bit lines BL, and memory cells MC.

As illustrated in FIG. 2 and FIG. 3, word lines WL1 to WL4 are disposed in the Z direction at predetermined pitches and extend in the X direction. The bit lines BL are disposed in a matrix in the X direction and the Y direction and extend in the Z direction. The memory cells MC are disposed at portions where these word lines WL and bit lines BL intersect. Accordingly, the memory cells MC are disposed in a three-dimensional matrix, the X, Y, and Z directions.

As illustrated in FIG. 2, the memory cell MC includes a variable resistive element VR. When the resistance value of the variable resistive element VR changes between a high resistance state and a low resistance state based on an applied voltage, the memory cell MC stores data in a non-volatile manner based on the resistance value. The variable resistive element VR changes from the high resistance state (a reset state) to the low resistance state (a setting state) by a setting operation. The setting operation applies a voltage at a certain magnitude or more to both ends of the variable resistive element VR. The variable resistive element VR changes from the low resistance state (the setting state) to the high resistance state (the reset state) by a reset operation. The reset operation applies a voltage at a certain magnitude or more to both ends of the variable resistive element VR. Immediately after the manufacture, the variable resistive element VR is in a state of not easily changing its resistive state and in the high resistance state. Therefore, a forming operation, which applies a high voltage equal to or more than the setting operation and the reset operation to both ends of the variable resistive element VR, is performed. This forming operation forms a region where a current is likely to locally flow in the variable resistive element VR (a filament path). This allows the variable resistive element VR to easily change the resistive state, being operable as a storage element.

To perform the setting operation in the embodiment, the word line WL is set to be relatively higher in electric potential than the bit line BL. To perform the reset operation, the word line WL is set to be relatively lower in electric potential than the bit line BL. The following describes the direction of the voltage that sets the word line WL to the low electric potential and sets the bit line BL to the high electric potential as a positive direction.

As illustrated in FIG. 2, the selection transistor STr is disposed between the one end of the bit line BL and the global bit line GBL. The global bit lines GBL are disposed at predetermined pitches in the X direction and extend in the Y direction. The one global bit line GBL is coupled to the one end portions of the plurality of selection transistors STr, which are disposed in a line in the Y direction, in common.

A gate electrode disposed between the two selection transistors STr, which are adjacently disposed in the Y direction, can be coupled in common to the selection transistors STr. The selection gate lines SG are disposed at predetermined pitches in the Y direction and extend in the X direction. The one selection gate line SG is coupled to the gates of the plurality of selection transistors STr, which are disposed in a line in the X direction, in common. The gate electrode between the two selection transistors STr, which are adjacently disposed in the Y direction, can be separated. Thus, the two selection transistors STr each can be independently operated.

Figure 4:
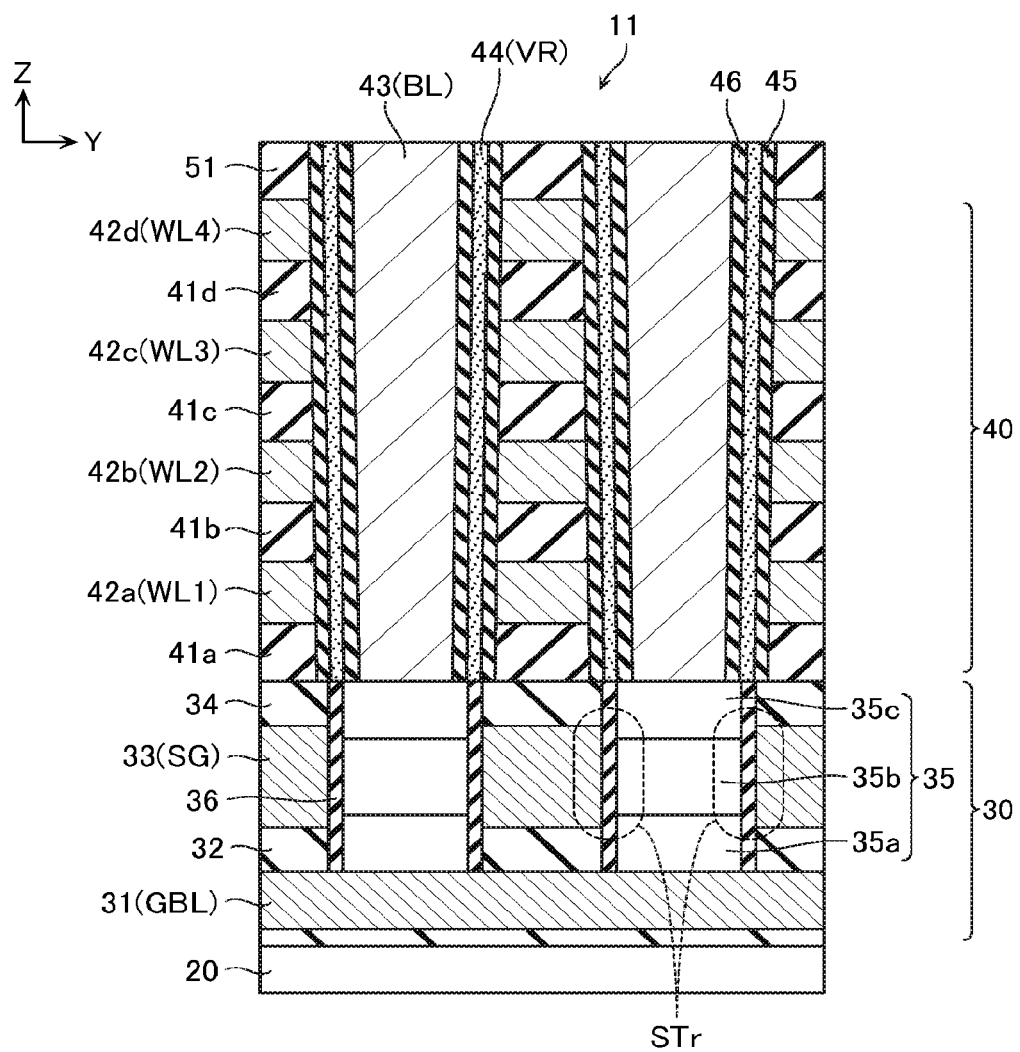
FIG. 4 is an exemplary cross-sectional view viewed from the X direction in FIG. 3.

The following describes the laminated structure of the memory cell array 11 according to the first embodiment with reference to FIG. 3 and FIG. 4. FIG. 4 is an exemplary cross-sectional view taken along the F4-F4 plane in FIG. 3. FIG. 3 omits the illustration of an interlayer insulating film.

The memory cell array 11, as illustrated in FIG. 3, includes a selection transistor layer 30 and a memory layer 40 laminated over a substrate 20. The selection transistor layer 30 functions as the selection transistor STr. The memory layer 40 functions as the memory cell MC.

As illustrated in FIG. 3 and FIG. 4, the selection transistor layer 30 includes conducting layers 31, interlayer insulating films 32, conducting layers 33, and interlayer insulating films 34. These conducting layers 31, interlayer insulating films 32, conducting layers 33, and interlayer insulating films 34 are laminated in the Z direction, which is perpendicular to the substrate 20. The conducting layer 31 functions as the global bit line GBL while the conducting layers 33 function as the gates of the selection gate line SG and the selection transistor STr.

The conducting layers 31 are disposed at predetermined pitches in the X direction, which is parallel to the substrate 20. The conducting layers 31 have a stripe shape extending in the Y direction. Between the plurality of conducting layers 31, interlayer insulating films (not illustrated) are formed. The conducting layer 31 is made of, for example, polysilicon.

The interlayer insulating films 32 are formed so as to cover the top surfaces of the conducting layers 31. The interlayer insulating film 32 has a role of electrically insulating the portion between the conducting layer 31 and the selection gate line SG (the conducting layer 33). The interlayer insulating film 32 is made of, for example, silicon oxide ($SiO_2$).

The conducting layers 33 are disposed at the predetermined pitches in the Y direction. The conducting layers 33 are formed into the stripe shape extending in the X direction.

The interlayer insulating films 34 are deposited so as to cover the top surfaces of the conducting layers 33. The conducting layer 33 is made of, for example, polysilicon. The interlayer insulating film 34 is made of, for example, silicon oxide ($SiO_2$).

As illustrated in FIG. 3 and FIG. 4, the selection transistor layer 30 includes, for example, columnar semiconductor layers 35 and gate insulating layers 36. The semiconductor layer 35 functions as a body (a channel) of the selection transistor STr. The gate insulating layer 36 functions as the gate insulating film of the selection transistor STr.

The semiconductor layers 35 are disposed in a matrix in the X and Y directions and extend in the Z direction. The semiconductor layer 35 is in contact with the top surfaces of the conducting layers 31. The semiconductor layer 35 is in contact with the side surface of the conducting layer 33 in the Y direction via the gate insulating layer 36. The semiconductor layer 35 includes an N+ type semiconductor layer 35*a*, a P+ type semiconductor layer 35*b*, and an N+ type semiconductor layer 35*c* laminated from the lower to the upper.

As illustrated in FIG. 3 and FIG. 4, the side surface of the N+ type semiconductor layer 35*a* in the Y direction is in contact with the interlayer insulating film 32 via the gate insulating layer 36. The side surface of the P+ type semiconductor layer 35*b* in the Y direction is in contact with the side surface of the conducting layer 33 via the gate insulating layer 36. The side surface of the N+ type semiconductor layer 35*c* in the Y direction is in contact with the interlayer insulating film 34 via the gate insulating layer 36. The N+ type semiconductor layers 35*a* and 35*c* are made of polysilicon into which N+ type impurities are injected. The P+ type semiconductor layer 35*b* is made of polysilicon into which P+ type impurities are implanted. The gate insulating layer 36 is made of, for example, silicon oxide ($SiO_2$).

As illustrated in FIG. 3 and FIG. 4, the memory layer 40 includes interlayer insulating films 41*a* to 41*d* and conducting layers 42*a* to 42*d* laminated in alternation in the Z direction. The conducting layers 42*a* to 42*d* each functions as the word lines WL1 to WL4. Viewed from the Z direction, the conducting layers 42*a* to 42*d* have a pair of comb shape each opposed in the X direction. The interlayer insulating films 41*a* to 41*d* are made of, for example, silicon oxide ($SiO_2$). The conducting layers 42*a* to 42*d* are made of, for example, polysilicon, a transition metal alone, or a nitride of the transition metal. As this transition metal, for example, hafnium (Hf), titanium (Ti), tantalum (Ta), tungsten (W), molybdenum (Mo), and platinum (Pt) can be used.

As illustrated in FIG. 3 and FIG. 4, the memory layer 40 includes, for example, columnar conducting layers 43, variable resistance layers 44, first barrier insulating layers 45, and second barrier insulating layers 46. The conducting layer 43 functions as the bit line BL. The variable resistance layers 44 function as the plurality of variable resistive elements VR. The first barrier insulating layer 45 and the second barrier insulating layer 46 are formed at both side surfaces of the variable resistance layer 44. The first barrier insulating layer 45 and the second barrier insulating layer 46 form a quantum well in the variable resistance layer 44.

The conducting layers 43 are disposed in a matrix in the X and Y directions. The lower end of the conducting layer 43 is in contact with the top surface of the semiconductor layer 35. The conducting layer 43 extends in a columnar manner in the Z direction. Between the conducting layers 43 disposed in the X direction, interlayer insulating films (not illustrated) are formed. The conducting layer 43 of this embodiment may have an inverting tapered shape whose width at the upper end portion is large and width at the lower end portion is small at a Z-Y cross section along the Z direction and the Y direction. The conducting layer 43 is made of, for example, a low resistance heavily doped polysilicon, a transition metal alone, or a nitride of the transition metal. As this transition metal, for example, hafnium (Hf), titanium (Ti), tantalum (Ta), tungsten (W), molybdenum (Mo), and platinum (Pt) can be used.

The variable resistance layer 44 is disposed between the side surface of the conducting layer 43 in the Y direction and the side surfaces of the interlayer insulating films 41*a* to 41*d* in the Y direction. The variable resistance layer 44 is also disposed between the side surface of the conducting layer 43 in the Y direction and the side surfaces of the conducting layers 42*a* to 42*d* in the Y direction. In the embodiment, the variable resistance layer 44 expands in a planar shape along a plane formed between the plurality of bit lines BL, which are disposed in the X direction, and the plurality of word lines WL, which are disposed in the Z direction. The variable resistance layer 44 is made of, for example, transition metal oxide. As this transition metal, for example, hafnium (Hf), titanium (Ti), tantalum (Ta), zirconium (Zr), and niobium (Nb) can be used. As long as a residual carrier concentration is low and a high resistance is obtained, the variable resistance layer 44 may be an oxide semiconductor. As this oxide semiconductor, for example, gallium oxide (for example, $Ga_2O_3$), which is a compound semiconductor of oxygen and gallium, and InGaZnO, which is a crystal formed by mixing the gallium oxide with In and Zn, can be used.

As described above, the quantum well is formed in the variable resistance layer 44. Therefore, the film thickness of the variable resistance layer 44 is adjusted to the film thickness to the extent where energy levels of electrons and holes in the variable resistance layer 44 are quantized and have discrete values. The film thickness of the variable resistance layer 44 is adjusted such that among the discrete energy levels in the variable resistance layer 44, at least the lowest energy level may be lower than energy barriers at the first barrier insulating layer and the second barrier insulating layer. The film thickness of the variable resistance layer 44 can be appropriately adjusted by materials of the variable resistance layer 44, the first barrier insulating layer 45, and the second barrier insulating layer 46 and other conditions. The film thickness of the variable resistance layer 44 is set to, for example, equal to or more than one atomic layer to 3 nm or less.

The first barrier insulating layer 45 is disposed between the side surfaces of the conducting layers 42*a* to 42*d* in the Y direction and the side surface of the variable resistance layer 44 in the Y direction. The second barrier insulating layer 46 is disposed between the side surface of the variable resistance layer 44 in the Y direction and the side surface of the conducting layer 43 in the Y direction. The first barrier insulating layer 45 and the second barrier insulating layer 46 are made of a material having electron affinity lower than that of the variable resistance layer 44 (a material having high energy barrier to the electrons). For example, in the case where the variable resistance layer 44 is made of the transition metal oxide, as the first barrier insulating layer 45 and the second barrier insulating layer 46, selecting a material whose electron affinity is smaller than that of the variable resistance layer 44 and whose energy barrier is sufficiently high (for example, $SiO_2$, SiON, $Si_3N_4$, and $Al_2O_3$) is preferable. Meanwhile, for example, in the case where the variable resistance layer 44 is made of the oxide semiconductor whose residual carrier concentration is low, as the first barrier insulating layer 45 and the second barrier insulating layer 46, the above-described material may be selected. For example, the transition metal oxide may be selected. This is because, generally, the electron affinity of the oxide semiconductor whose residual carrier concentration is low is greater than the electron affinity of the transition metal oxide. The embodiment selects the transition metal oxide as the material of the variable resistance layer 44.

For example, the first barrier insulating layer 45 and the second barrier insulating layer 46 may be made of a material whose energy barrier to the hole is higher than that of the variable resistance layer 44. Here, the "energy barrier to the hole" means an energy difference from a vacuum level to the lowest in an energy gap (the uppermost in a valence band). The energy barrier is equivalent to the sum of the electron affinity and the energy gap.

With the embodiment, the voltage is applied between the bit line BL and the word line WL to flow the current from the bit line BL to the word line WL or from the word line WL to the bit line BL via the variable resistance layer 44. Accordingly, the first barrier insulating layer 45 and the second barrier insulating layer 46 are formed sufficiently thin. The embodiment sets the film thicknesses of the first barrier insulating layer 45 and the second barrier insulating layer 46 to 1 nm or less.

Here, as described above, with the embodiment, the quantum well is formed in the variable resistance layer 44. The energy levels of the electrons and the holes in the variable resistance layer 44 are quantized and have the discrete values. For example, a difference between the electron affinity of the variable resistance layer 44 and the electron affinity of the first barrier insulating layer 45 is defined as $\Delta_{\chi 1}$. A difference between the electron affinity of the variable resistance layer 44 and the electron affinity of the second barrier insulating layer 46 is defined as $\Delta_{\chi 2}$. The film thickness of the variable resistance layer 44 is defined as T. An effective mass of electrons in a conduction band of the variable resistance layer 44 is defined as m. A Planck constant is defined as h. In the case where at least the following formula (1) and formula (2) are met, it is considered that the energy levels of the electrons in the variable resistance layer 44 are quantized and have the discrete values.

$$\frac{h^2}{8mT^2} < \Delta\chi_1 \quad \text{Formula (1)}$$

$$\frac{h^2}{8mT^2} < \Delta\chi_2 \quad \text{Formula (2)}$$

Further, the energy gap of the variable resistance layer 44 is defined as $E_g$. The electron affinity of the variable resistance layer 44 is defined as $\chi$. The energy gap of the first barrier insulating layer 45 is defined as $E_{g1}$. The electron affinity of the first barrier insulating layer 45 is defined as $\chi 1$. The energy gap of the second barrier insulating layer 46 is defined as $E_{g2}$. The electron affinity of the second barrier insulating layer 46 is defined as $\chi 2$. The film thickness of the variable resistance layer 44 is defined as T. The effective mass of the hole in the valence band of the variable resistance layer 44 is defined as m. The Planck constant is defined as h. In the case where at least the following formula (3) and formula (4) are met, it is considered that the energy levels of the holes in the variable resistance layer 44 are quantized and have the discrete values.

$$\frac{h^2}{8mT^2} < (\chi_1 + E_{g1}) - (\chi + E_g) \quad \text{Formula (3)}$$

$$\frac{h^2}{8mT^2} < (\chi_2 + E_{g2}) - (\chi + E_g) \quad \text{Formula (4)}$$

Figure 5:
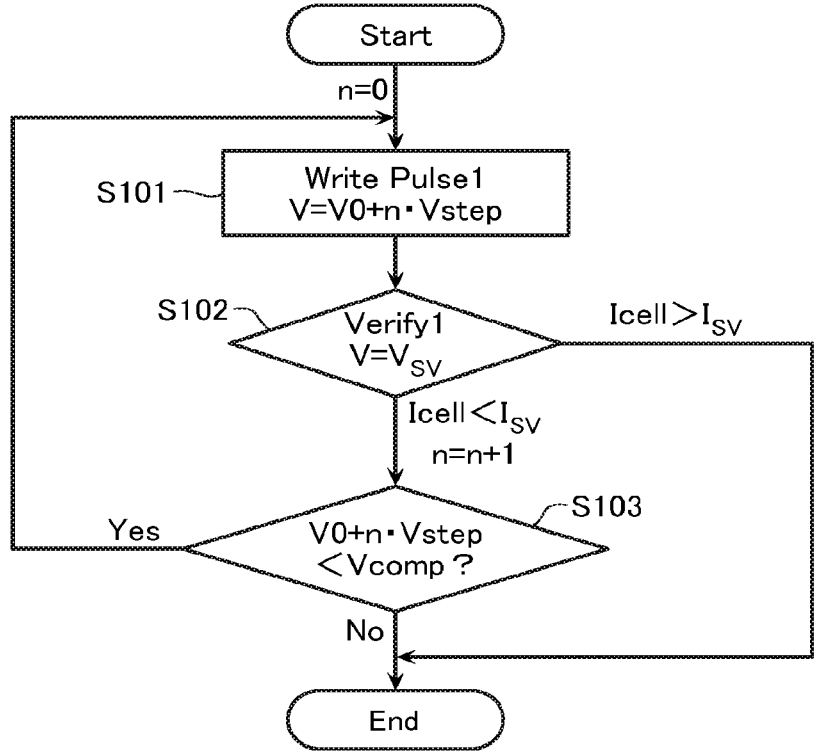
FIG. 5 is a flowchart for describing a method of a setting operating according to the embodiment.
Figure 6:
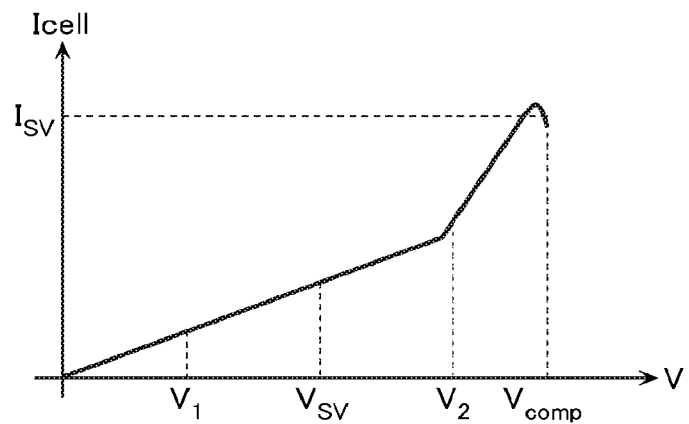
FIG. 6 is a schematic graph for describing the setting operation.

The following describes the setting operation according to the first embodiment with reference to FIG. 5 to FIG. 10. FIG. 5 is a flowchart for describing the method of the setting operating according to the first embodiment. FIG. 6 is a schematic graph for describing the setting operation. The horizontal axis indicates the magnitude of a voltage V applied between the bit line BL and the word line WL. The vertical axis indicates a cell current Icell flowing through the memory cell MC.

As shown in FIG. 5, the setting operation according to the embodiment repeatedly performs a voltage applying step S101 and a verification step S102. As illustrated in FIG. 5 and FIG. 6, the voltage applying step S101 gradually increases the voltage V, which is applied between the bit line BL and the word line WL. At a point when the cell current Icell reaches a threshold current $I_{SV}$, the setting operation is terminated. When the voltage V reaches a compliance voltage Vcomp, the setting operation is halted (Step S103).

As illustrated in FIG. 5, the voltage applying step S101 applies V0+n·Vstep to the selected memory cell MC as a write voltage. Here, the write initial voltage V0 means the initial value of the write voltage. A step voltage Vstep means the increment width of the write voltage. "n" indicates an integer representing a count of executions of the voltage applying step S101. After terminating the voltage applying step S101, the verification step S102 is performed. The following description treats Vstep as a constant value for convenience. However, the Vstep value may be decreased or increased together with n. The n-time Vstep value may be preliminarily decided with a table. Further, the Vstep value may be the function of n.

As illustrated in FIG. 5, the verification step S102 applies a set verification voltage $V_{SV}$ smaller than the write voltage to the selected memory cell MC. Then, the cell current Icell is compared with the threshold current $I_{SV}$. In the case where the cell current Icell is smaller than the threshold current $I_{SV}$, it is determined that the selected memory cell MC does not pass the verification step S102. In this case, n is increased by only one and a voltage confirmation step S103 is performed. Meanwhile, in the case where the cell current Icell is larger than the threshold current $I_{SV}$, it is determined that the selected memory cell MC has passed the verification step S102. In this case, the setting operation is terminated. The magnitude of the set verification voltage $V_{SV}$ is set to a magnitude to the extent where the resistance value of the selected memory cell MC does not change.

As illustrated in FIG. 5, the voltage confirmation step S103 confirms whether the write voltage V0+n·Vstep is smaller than the compliance voltage Vcomp or not. When the write voltage is smaller than the compliance voltage Vcomp, the voltage applying step S101 is performed again. Meanwhile, when the write voltage is equal to or more than the compliance voltage Vcomp, as described above, the setting operation is halted. As illustrated in FIG. 6, with the embodiment, when the voltage applied between the bit line BL and the word line WL reaches the compliance voltage Vcomp, a differential negative resistance, which decreases the cell current Icell in association with an increase in voltage, occurs in the memory cell MC. This is caused by the following circumstance. As will be described later with reference to FIG. 10, the quantum well is formed in the variable resistance layer 44. When a fermi level Ef in the bit line BL becomes higher than discrete energy levels WE in this quantum well, a direct tunneling current that can be injected to the variable resistance layer 44 via the second barrier insulating layer 46 is reduced. The following refers to the voltage V at which the cell current Icell becomes a local maximal value by the differential negative resistance as a "differential negative resistance bias point."

The following describes the state of the memory cell MC during the setting operation with reference to FIG. 7 to FIG. 10. FIG. 7 to FIG. 10 are schematic energy band diagrams for describing the state of the memory cell MC during the setting operation.

Figure 7:
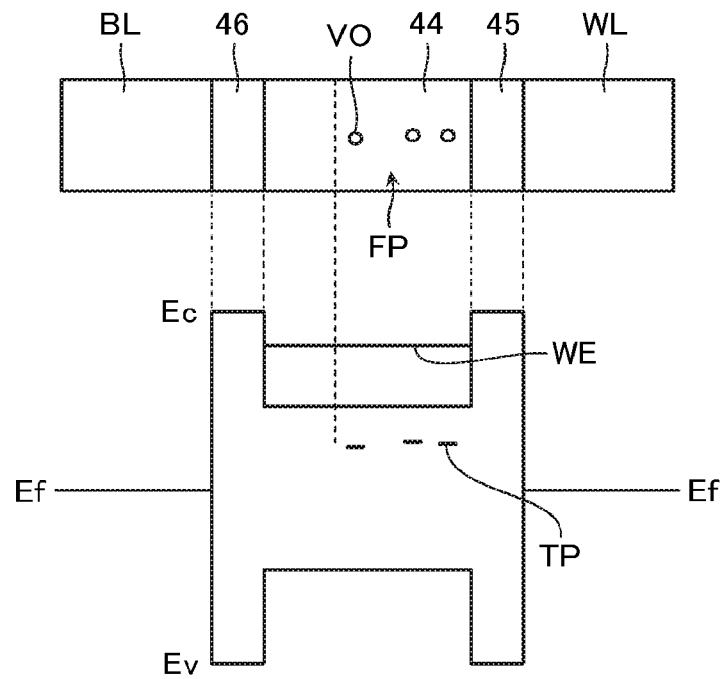
FIG. 7 is a schematic energy band diagram for describing a state of a memory cell MC during the setting operation.

The schematic enlarged view of FIG. 4 is illustrated at the upper portion in FIG. 7. The energy band diagram at the lower portion in FIG. 7 corresponds to the enlarged view illustrated at the upper portion in FIG. 7. As illustrated in FIG. 7, a filament path FP formed of a plurality of oxygen defects VO is formed in the variable resistance layer 44. The oxygen defects VO are parts where oxygen atoms are absent in the variable resistance layer 44 made of metal oxide. The area, where oxygen defects VO are exist, has a low resistance compared with other parts where the oxygen atoms are present. The oxygen defects VO form trap levels TP in the variable resistive element VR.

As illustrated in FIG. 7, the first barrier insulating layer 45 and the second barrier insulating layer 46 are formed at both side surfaces of the variable resistance layer 44. The quantum well is formed in the variable resistance layer 44. In other words, both side surfaces at the upper end of the band gap in the variable resistance layer 44 are covered with the energy barriers. The energy levels WE in the variable resistance layer 44 have the discrete values. FIG. 7 illustrates an example where only one energy level WE is present in the variable resistance layer 44. However, the count of energy levels WE present in the variable resistance layer 44 depends on the electron affinity and the electron effective mass of the materials of the variable resistance layer 44, the first barrier insulating layer 45, and the second barrier insulating layer 46. Accordingly, the plurality of energy levels may be present in the variable resistance layer 44 or the energy level may be absent. The count of the energy levels WE that can be formed in the quantum well approximately corresponds to the count of the above-described differential negative resistance bias points.

Figure 8:
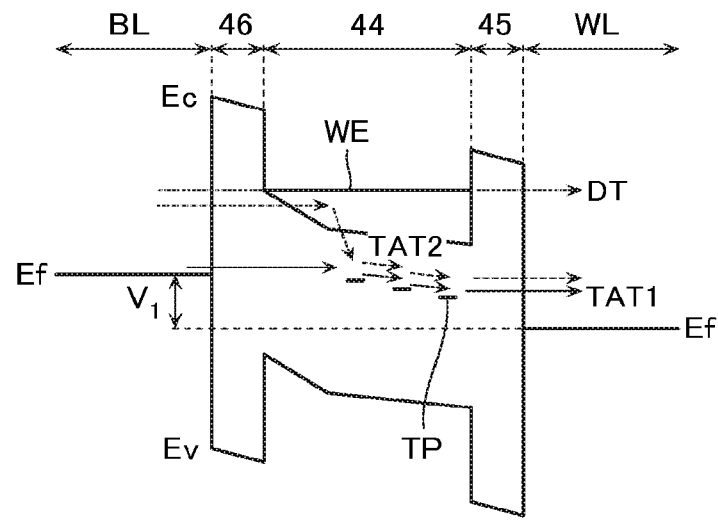
FIG. 8 is a schematic energy band diagram for describing another state of the memory cell MC during the setting operation.

As illustrated in FIG. 6, the application of a voltage $V_1$ between the bit line BL and the word line WL flows the cell current Icell. The solid line arrows, the dotted line arrows, and the one dot chain line arrows in FIG. 8 schematically show components of the cell currents Icell at this timing. The solid line arrows in FIG. 8 schematically indicate a path of a first trap-assisted tunneling (TAT) current TAT1. The dotted line arrows in FIG. 8 schematically indicate a path of a second TAT current TAT2. The one dot chain line arrows in FIG. 8 schematically indicate the path of a direct tunneling current DT. At this timing of small voltage, the first TAT current TAT1 is dominant. The second TAT current TAT2 and the direct tunneling current DT are trace compared with the first TAT current TAT1.

As illustrated in FIG. 8, the first TAT current TAT1 flows as follows. That is, at this timing, the electrons near the fermi level Ef of the bit line BL directly tunnel a region where the trap levels TP of the second barrier insulating layer 46 and the variable resistance layer 44 are not formed. Then, the electrons are once captured by the trap levels TP in the variable resistance layer 44. The captured electrons tunnel via the plurality of trap levels TP formed in the variable resistance layer 44. Then, the electrons move to the trap level TP near the word line WL. The electrons that have reached the trap level TP near the word line WL tunnel the first barrier insulating layer 45 from this trap level TP and move to the word line WL.

As illustrated in FIG. 8, the second TAT current TAT2 flows as follows. That is, at this timing, the electrons in the bit line BL directly tunnel the second barrier insulating layer 46 and move to the discrete energy levels WE in the variable resistance layer 44. After that, the electrons are scattered in the conduction band in the variable resistance layer 44, losing the energy and the momentum. Then, the electrons are captured by the trap levels TP in the variable resistance layer 44. Afterwards, similar to the first TAT current TAT1, the electrons move to the trap level TP near the word line WL via the plurality of trap levels TP in the variable resistance layer 44. The electrons tunnel the first barrier insulating layer 45 and move to the word line WL.

As illustrated in FIG. 8, the direct tunneling current DT flows by the electrons in the bit line BL directly tunneling to the word line WL. In the direct tunneling current DT, a resonance tunneling current through a resonance level (the energy level WE) is dominant.

Figure 9:
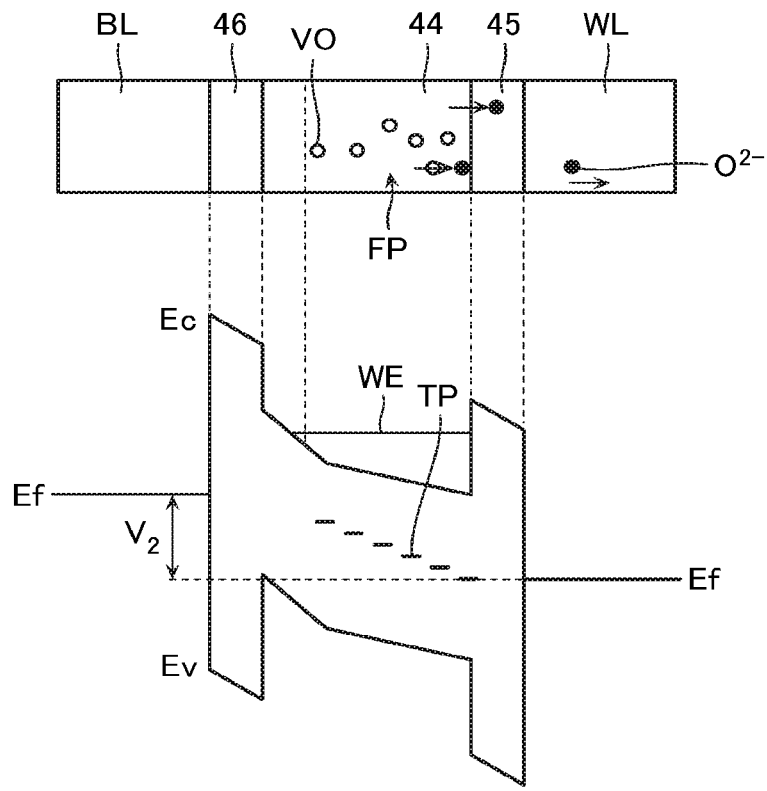
FIG. 9 is a schematic energy band diagram for describing another state of the memory cell MC during the setting operation.

As illustrated in FIG. 6, when the voltage between the bit line BL and the word line WL increases to $V_2$, the increment of the cell current Icell to the increment of the voltage V increases. At this timing, as illustrated in FIG. 9, oxygen ion $O^{2-}$ in the variable resistance layer 44 moves to the word line WL direction. This increases the count of oxygen defects VO in the variable resistance layer 44. This grows the filament path FP and reduces the resistance of the variable resistance layer 44.

It seems the oxygen ions $O^{2-}$ move under a certain threshold value of an electric field in the variable resistance layer 44. When the TAT current flows through the filament path FP, a Joule heat is generated in the filament path FP. The temperature locally increases compared with the ambient temperature. This local high temperature possibly promotes the movement of the oxygen ion $O^{2-}$.

As illustrated in FIG. 9, the increase in the voltage V lowers a bottom $E_c$ of the conduction band of the variable resistance layer 44 toward the fermi level Ef of a bit line BL electrode. The electrons of the bit line BL electrode increases the components of the second TAT current TAT2 and the direct tunneling current DT in addition to the component of the first TAT current TAT1 directly captured by the trap levels TP. As the embodiment forms the quantum well in the variable resistance layer 44, the energy levels WE of the electrons in the variable resistance layer 44 have the discrete values. Therefore, among the electrons near the fermi level of the bit line BL, the electrons moving to the variable resistance layer 44 as the second TAT current TAT2 or the direct tunneling current DT are restricted to the electrons near the energy level identical to the energy level WE.

Figure 10:
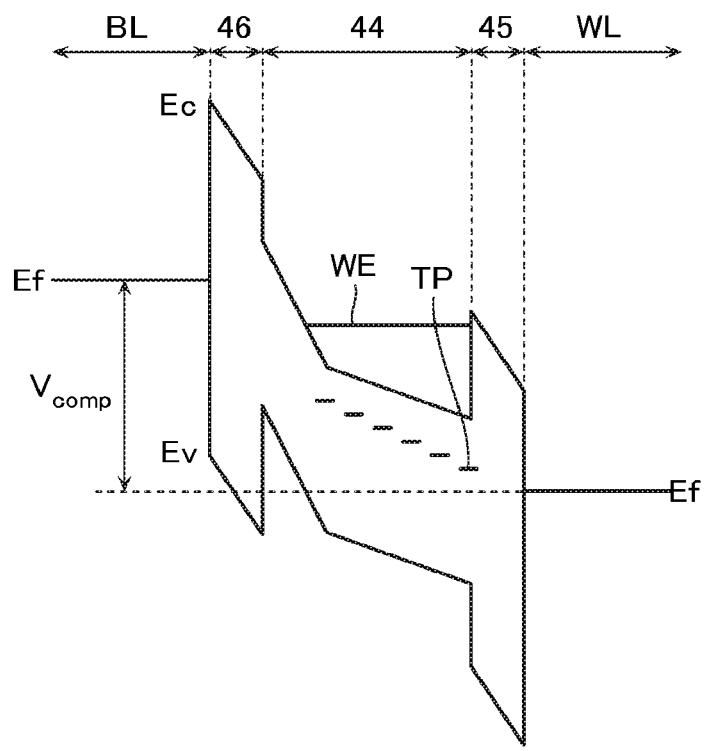
FIG. 10 is a schematic energy band diagram for describing another state of the memory cell MC during the setting operation.

As illustrated in FIG. 6, the increase in the voltage V between the bit line BL and the word line WL to Vcomp generates the differential negative resistance at which the cell current Icell decreases in association with the increase in the voltage V. Here, with the state described with reference to FIG. 7 to FIG. 9, the fermi level Ef in the bit line BL was lower than the energy level WE in the variable resistance layer 44. Meanwhile, as illustrated in FIG. 10, at this timing where the voltage between the bit line BL and the word line WL reaches Vcomp, the fermi level Ef in the bit line BL becomes higher than the energy level WE in the variable resistance layer 44. Here, when gradually increasing the voltage V between the bit line BL and the word line WL, until the fermi level Ef in the bit line BL approximately matches the energy level WE in the variable resistance layer 44 (until the voltage V reaches a resonance bias point), the cell current Icell monotonously increases. Meanwhile, when further increasing the voltage V and the voltage V exceeds the resonance bias point, the differential negative resistance occurs and the current once decreases. The differential negative resistance bias points may be present by the count of resonance bias points, namely, the count of quantized energy levels WE formed in the variable resistance layer 44.

Figure 11:
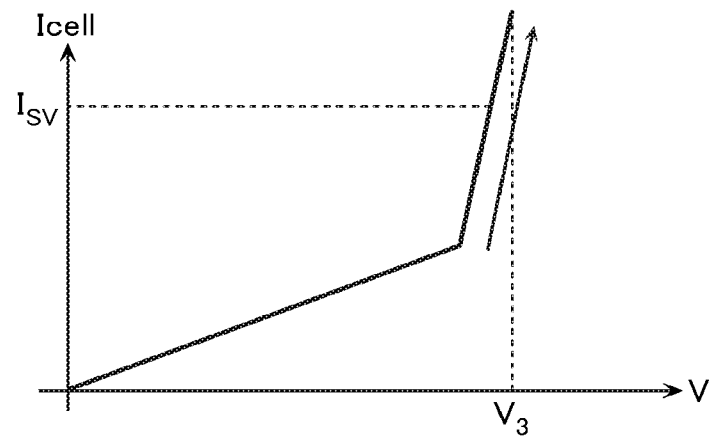
FIG. 11 is a schematic graph for describing a setting operation of a semiconductor memory device according to a comparative example.
Figure 12:
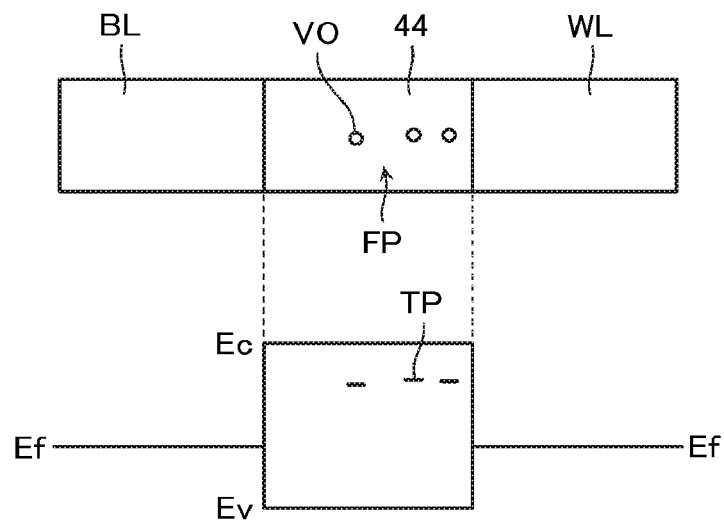
FIG. 12 is a schematic energy band diagram for describing another state of the memory cell MC during the setting operation.
Figure 13:
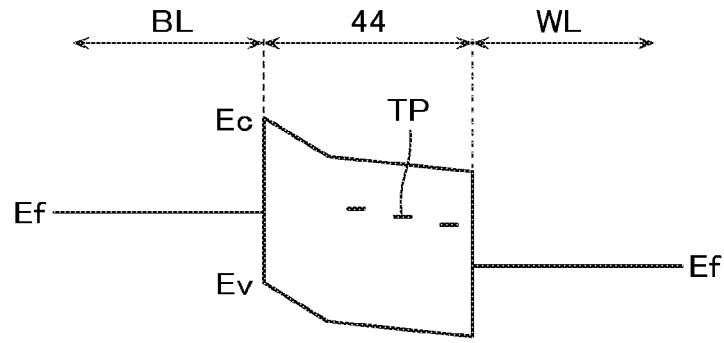
FIG. 13 is a schematic energy band diagram for describing the state of another memory cell MC during the setting operation.
Figure 14:
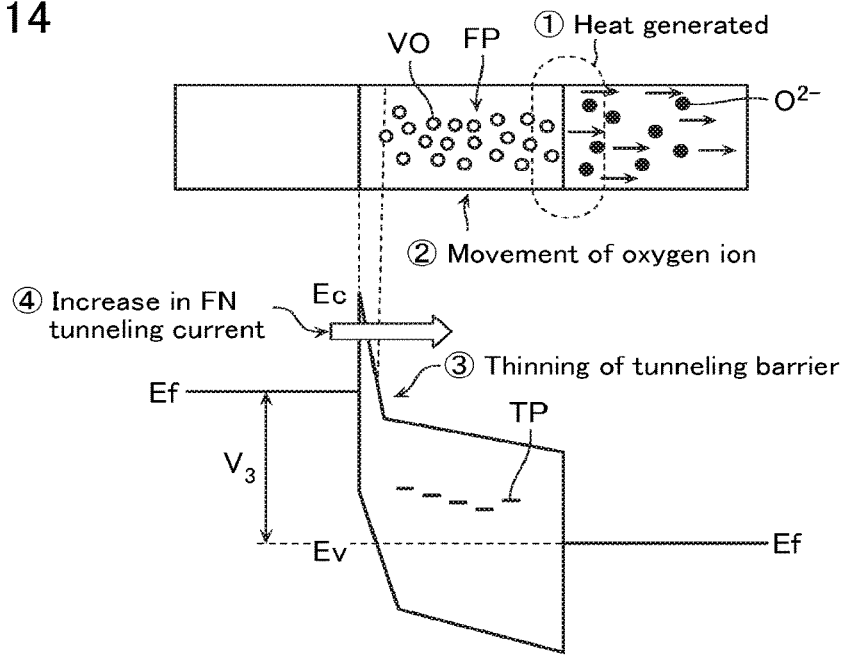
FIG. 14 is a schematic energy band diagram for describing another state of the memory cell MC during the setting operation.

The following describes a semiconductor memory device according to a comparative example with reference to FIG. 11 to FIG. 14. FIG. 11 is a schematic graph for describing the setting operation of the semiconductor memory device according to the comparative example. FIG. 12 to FIG. 14 are schematic energy band diagrams for describing the state of the memory cell MC during the setting operation.

As illustrated in FIG. 12, the semiconductor memory device according to the comparative example does not include the first barrier insulating layer 45 and the second barrier insulating layer 46. Accordingly, the semiconductor memory device according to the comparative example does not include the quantum well in the variable resistance layer 44.

As illustrated in FIG. 13, in the case where the voltage V is equal to or less than a predetermined voltage, the following is considered. The TAT current flows between the bit line BL and the word line WL via the trap levels TP in the variable resistance layer 44. Then, a slight current flows via the conduction band of the variable resistance layer 44 by ohmic conduction.

As illustrated in FIG. 11, the application of a voltage $V_3$ to the semiconductor memory device according to the comparative example rapidly increases the cell current Icell to a value larger than the threshold current $I_{SV}$. It is considered that a phenomenon like the following occurs at this timing.

As illustrated in FIG. 14, when the voltage V reaches the predetermined voltage $V_3$, a tunneling current (FN tunneling current) flows through the variable resistance layer 44. When the electrons reach the word line WL by the tunneling current, the energy of the electrons is reduced, generating the Joule heat. This promotes the movement of the oxygen ion $O^{2-}$ in the variable resistance layer 44, increasing the count of oxygen defects VO in the variable resistance layer 44. This grows the filament path FP and decreases the energy barrier between the filament path FP and the bit line BL. This increases the electric field between the filament path FP and the bit line BL. This further promotes the movement of the oxygen ion $O^{2-}$ and grows the filament path FP, reducing the resistance. That is, if the voltage V reaches the predetermined voltage $V_3$, the following positive feedback occurs to the reciprocal number of the resistance value in the variable resistance layer 44 (conductivity). The current flows.→The Joule heat increases.→The filament path FP increases.→The current further flows.→The Joule heat further increases.→The filament path FP further increases.→ . . . . Such destructive phenomenon increases the oxygen defects VO in the variable resistance layer 44 to equal to or more than the predetermined amount. This possibly makes it difficult to return the variable resistance layer 44 to the low resistance state.

In this respect, as described with reference to FIG. 9, the semiconductor memory device according to the embodiment restricts the tunneling current by the quantum well, which is formed in the variable resistance layer 44. Therefore, the semiconductor memory device according to the embodiment restrains the increase in Joule heat in association with the increase in tunneling current and the rapid increase in the oxygen defects VO in association with this increase. Accordingly, the semiconductor memory device allows preferably controlling the resistance value of the variable resistive element VR.

As described with reference to FIG. 10, the increase in the voltage between the bit line BL and the word line WL to Vcomp lowers the energy level in the variable resistance layer 44 more than the fermi level Ef in the bit line, significantly reducing the tunneling current. Therefore, even if the electric field in the variable resistance layer 44 is increased during the setting operation, the tunneling current flowing through the variable resistance layer 44 and the local temperature in association with this increase does not monotonously increase. This restrains the rapid increase in the oxygen defects VO. This allows preferably controlling the resistance value of the variable resistive element VR.

Here, it is also considered that a phenomenon like the one described with reference to FIG. 14 is prevented by disposing a current limiting element at, for example, the periphery of the bit line BL, the word line WL, or the variable resistance layer 44. The example of the current limiting element, which restricts the current, is a field-effect transistor or a diode. However, as described with reference to FIG. 3 or a similar drawing, the semiconductor memory device according to the embodiment includes the plurality of word lines WL, which are laminated via the insulating layers, and the bit lines BL, which extend in a laminating direction. The variable resistance layer 44 is formed between the sidewall of the word line WL and the sidewall of the bit line BL. With such configuration, it is difficult to dispose the current limiting element between the bit line BL and the word line WL in terms of space.

Figure 15:
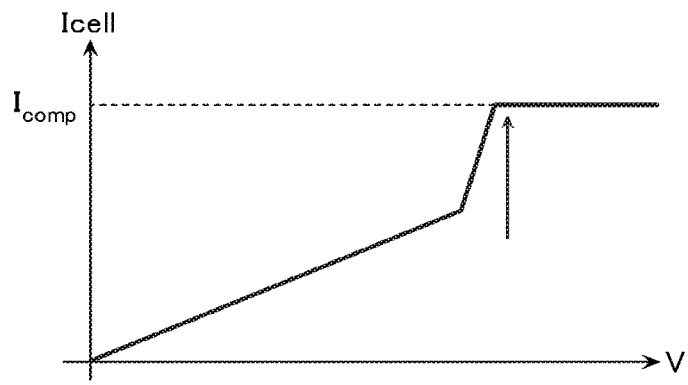
FIG. 15 is a schematic graph for describing a setting operation of a semiconductor memory device according to another comparative example.
Figure 16:
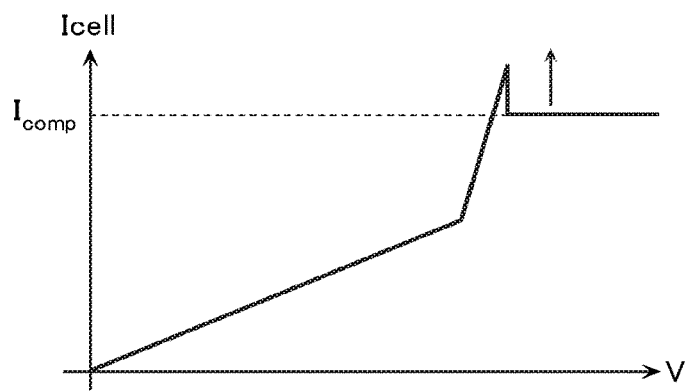
FIG. 16 is a schematic graph for describing a setting operation of a semiconductor memory device according to yet another comparative example.

As described with reference to FIG. 3 or a similar drawing, the embodiment includes the selection transistor STr at the lower end of the bit line BL. It is also considered to restrict the current by this selection transistor STr. However, as illustrated in FIG. 3, the embodiment forms the plurality of memory cells MC in the laminating direction along the bit lines BL. Accordingly, depending on the memory cell MC, a distance to the selection transistor STr greatly differs. Therefore, as illustrated in FIG. 15, the current can be preferably restricted at the memory cell MC whose distance from the selection transistor STr is comparatively close. However, as illustrated in FIG. 16, the memory cell MC whose distance from the selection transistor STr is comparatively far permits a transitional current. This possibly generates the phenomenon as illustrated in FIG. 14.

In this respect, as described with reference to FIG. 3 or a similar drawing, the semiconductor memory device according to the embodiment includes the first barrier insulating layer 45 and the second barrier insulating layer 46 at both side surfaces of the variable resistance layer 44. Accordingly, the formation of the quantum well in the variable resistance layer 44 allows restricting the current by the variable resistance layer 44 itself and restraining the phenomenon like the one described with reference to FIG. 14.

[Examinations on Film Thickness and Material]

Figure 17:
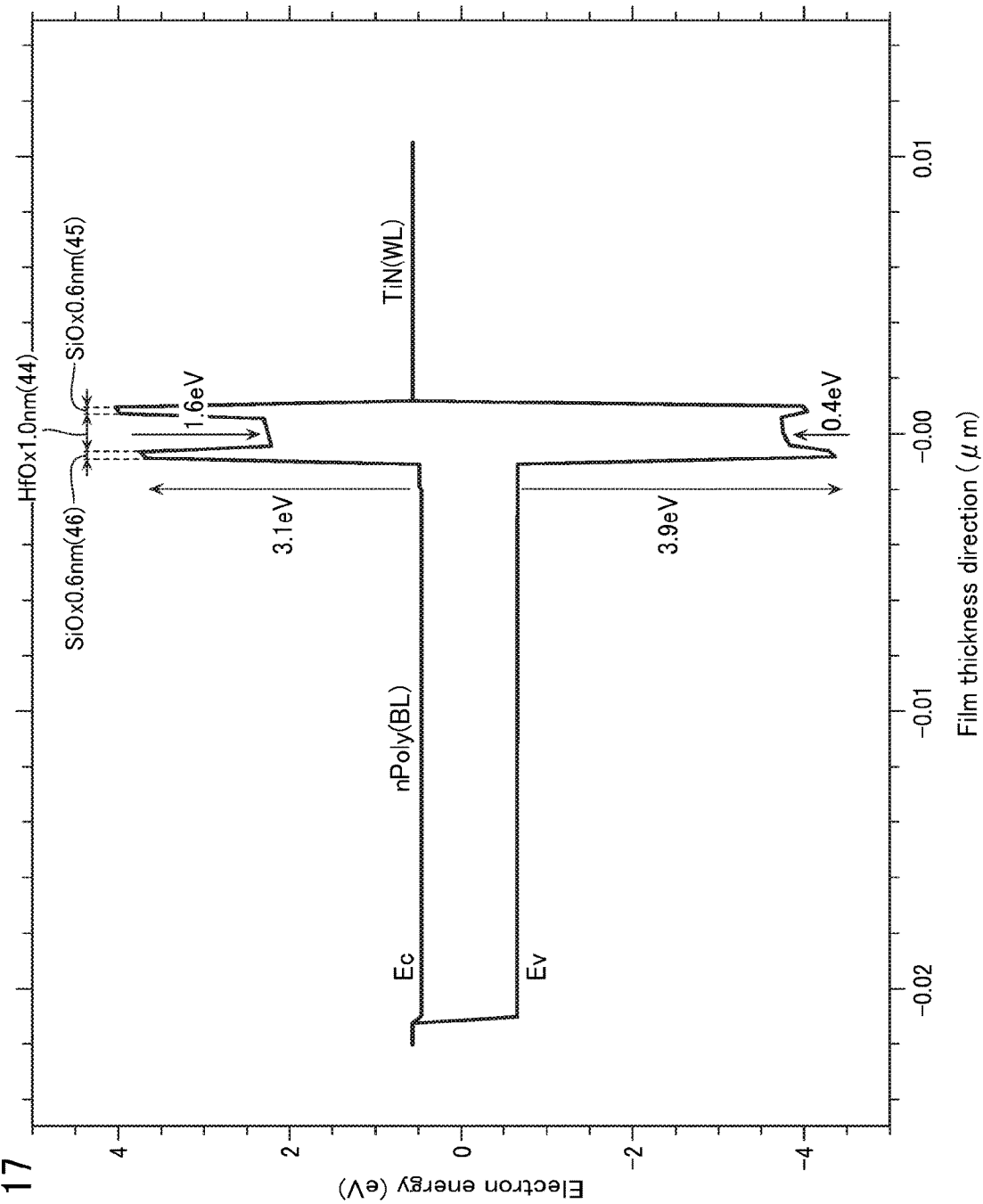
FIG. 17 is an energy band diagram showing results of a first calculation.

The following describes results of calculations performed by the inventors with reference to FIG. 17 to FIG. 23. First, with reference to FIG. 17, the following describes results of a first calculation. FIG. 17 is an energy band diagram showing results of the first calculation.

The first calculation calculated the energy band of a first calculation model. The first calculation model employs polysilicon as the bit line BL, $SiO_x$ of 0.6 nm as the second barrier insulating layer 46, $HfO_x$ of 1.0 nm as the variable resistance layer 44, $SiO_x$ of 0.6 nm as the first barrier insulating layer 45, and TiN as the word line WL.

In this case, as illustrated in FIG. 17, the energy barrier at 3.1 eV was formed against the electrons at the interface between the bit line BL and the second barrier insulating layer 46. Additionally, the energy barrier at 3.9 eV was formed against the holes. The energy barrier at 1.6 eV was formed against the electrons at interfaces between the variable resistance layer 44 and the first barrier insulating layer 45, and between the variable resistance layer 44 and the second barrier insulating layer 46. Additionally, the energy barrier at 0.4 eV was formed against the holes.

Figure 18:
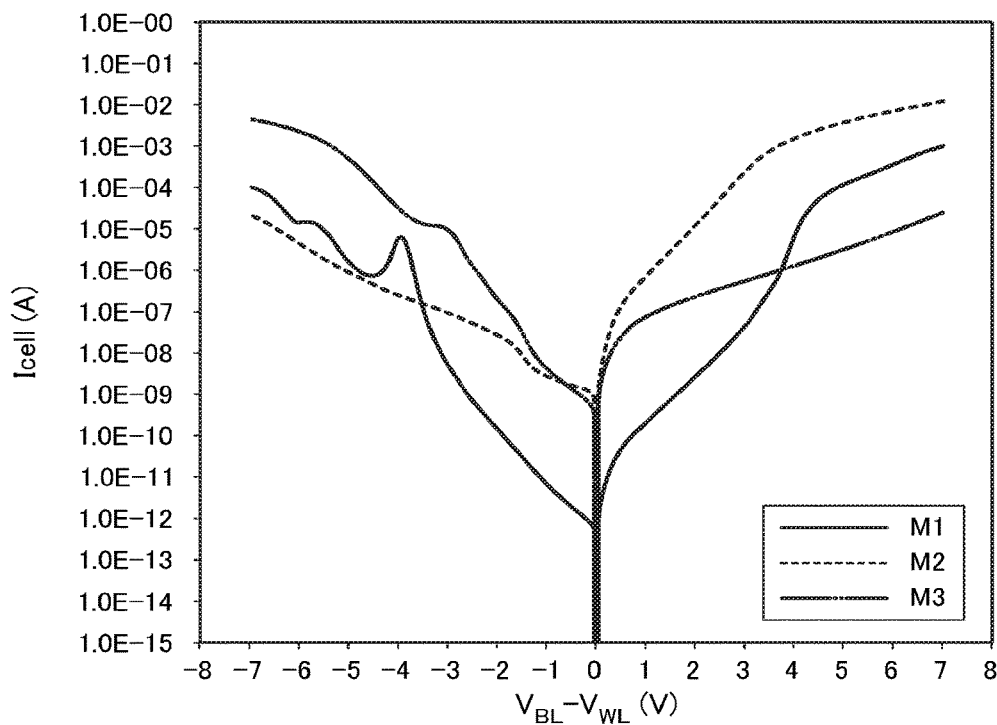
FIG. 18 is a graph of current-voltage characteristics showing results of a second calculation.
Figure 19:
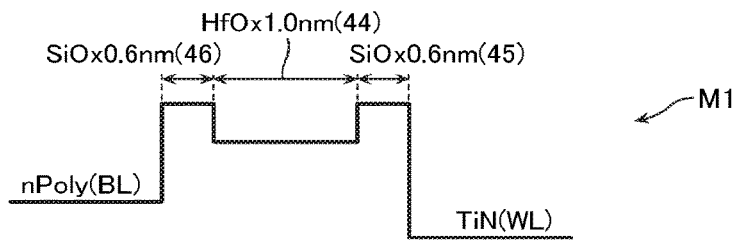
FIG. 19 is an energy band diagram illustrating a first calculation model used for the second calculation.
Figure 20:
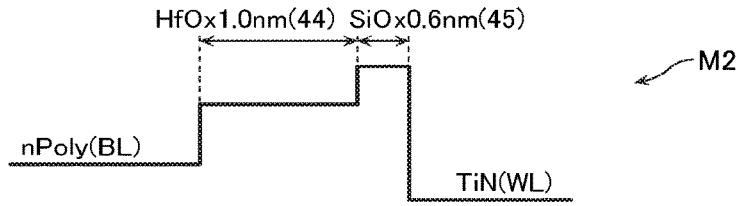
FIG. 20 is an energy band diagram illustrating a second calculation model used for the second calculation.
Figure 21:
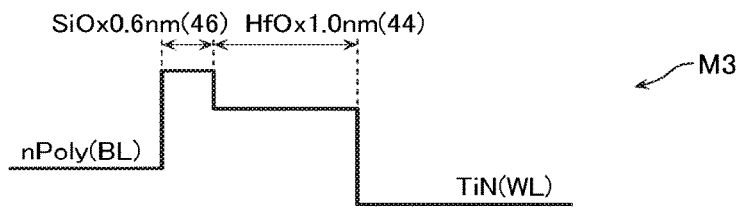
FIG. 21 is an energy band diagram illustrating a third calculation model used for the second calculation.

The following describes results of a second calculation with reference to FIG. 18 to FIG. 21. FIG. 18 is a graph of current-voltage characteristics showing the results of the second calculation. In FIG. 18, the horizontal axis indicates the voltage V applied between the bit line BL and the word line WL. The vertical axis indicates the magnitude of the cell current Icell flowing between the bit line BL and the word line WL by logarithm. FIG. 19 to FIG. 21 are energy band diagrams illustrating a first calculation model M1, a second calculation model M2, and a third calculation model M3 used for the second calculation. FIG. 19 to FIG. 21 illustrate schematic diagrams of the bottom of the conduction band and the fermi level of TiN corresponding to the first to third calculation models M1 to M3.

As illustrated in FIG. 18, the second calculation calculated the current-voltage characteristics of the first calculation model M1, the second calculation model M2, and the third calculation model M3. As illustrated in FIG. 19, the first calculation model M1 is a model having the electron energy barrier equivalent to the above-described first calculation result (FIG. 17). As illustrated in FIG. 20, the second calculation model M2 is basically similar to the first calculation model M1 but does not include the second barrier insulating layer 46. As illustrated in FIG. 21, the third calculation model M3 is basically similar to the first calculation model M1 but does not include the first barrier insulating layer 45. Accordingly, in the second calculation model M2 and the third calculation model M3, the electron energy barriers are not formed on both sides of the variable resistance layer 44, and therefore the quantum well is not formed in the variable resistance layer 44. In the second calculation, the range of −7 V to 7 V is considered as the applied voltage. The second calculation calculates only the direct tunneling current. Therefore, this method does not accommodate the TAT current.

As illustrated in FIG. 18, the application of the voltage in the negative direction to the first calculation model M1 became the cell current Icell to the local maximal value when the voltage V reached around −4.0 V. When the voltage V reached around −4.5 V, the cell current Icell became the local minimal value. During this time, the cell current Icell was reduced to one-tenth magnitude. When the voltage V reached around −5.7 V, the cell current Icell became the local maximal value. When the voltage V reached around −6.0 V, the cell current Icell became the local minimal value. Afterwards, in association with the reduction in voltage (the increase in the magnitude of the voltage), the cell current Icell increased. As described above, the following has been confirmed. In the first calculation model M1, which has the quantum well in the variable resistance layer 44, the differential negative resistance where the cell current decreases in association with the increase in the applied voltage occurred. The above-described differential negative resistance bias point is near −4.0 V and near −5.7 V. Meanwhile, in the second calculation model M2 and the third calculation model M3, the differential negative resistance did not occur.

With the second calculation, in the first calculation model M1, the differential negative resistance where the cell current Icell decreases in association with the increase in the voltage V occurred. Therefore, it is considered that the use of the conditions similar to the first calculation model M1 obtains the configuration exhibiting the differential negative resistance at the predetermined voltage.

With the second calculation, the differential negative resistance occurred in the first calculation model M1, which includes the quantum well in the variable resistance layer 44. Meanwhile, the differential negative resistance did not occur in the second calculation model M2 and the third calculation model M3, which do not include the quantum well. Accordingly, it is considered that the differential negative resistance in the first calculation model M1 occurred by the principle described with reference to FIG. 7 to FIG. 10.

In the first calculation model M1, the differential negative resistance occurred in the range of the applied voltage being −4.5 V to −4.0 V and in the range of the applied voltage being −6.0 V to −5.7 V. Therefore, it is considered that the use of the conditions similar to the first calculation model M1 generated the differential negative resistance twice during the adjustment of the applied voltage in −7 V to 0 V. It is considered that as described above, the configuration showing such characteristics includes the two discrete energy levels WE (see FIG. 7 to FIG. 10) at the quantum well in the variable resistance layer 44 according to calculations. Meanwhile, in the second calculation model M2 and the third calculation model M3, the differential negative resistance did not occur. Accordingly, it is considered that in the second calculation model M2 and the third calculation model M3, the quantum well in the variable resistance layer 44 does not include the discrete energy levels WE.

Figure 22:
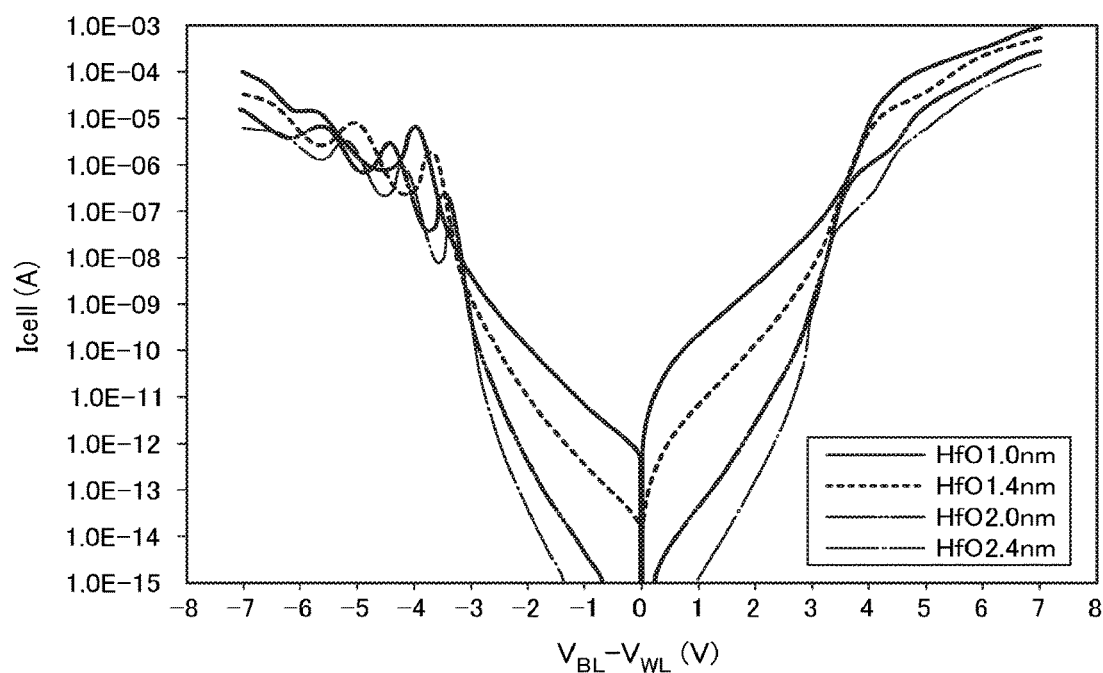
FIG. 22 is a graph of the current-voltage characteristics showing results of a third calculation.

The following describes the results of the third calculation with reference to FIG. 22. FIG. 22 is a graph of current-voltage characteristics showing the results of the third calculation. In FIG. 22, the horizontal axis indicates the voltage V applied between the bit line BL and the word line WL. The vertical axis indicates the magnitude of the cell current Icell flowing between the bit line BL and the word line WL by logarithm.

The third calculation calculated the current-voltage characteristics of fourth to sixth calculation models in addition to the first calculation model whose film thickness of the variable resistance layer 44 is 1 nm. The fourth to sixth calculation models are basically similar to the first calculation model except that the film thickness of the variable resistance layer 44 is 1.4 nm, 2.0 nm, and 2.5 nm, respectively.

Assuming that the film thickness of the variable resistance layer 44 as T and the electronic barriers of the barrier layers 45 and 46 being significantly large, the following is met on the nth energy $WE_n$ in the quantum well.

$$WE_n \sim \frac{\hbar^2}{2m}\left(\frac{\pi}{T}n\right)^2 \propto \left(\frac{n}{T}\right)^2$$

Here, hbar means a Dirac constant, and m means the electron effective mass of the variable resistance layer 44. Therefore, the following is expected to the fourth to sixth calculation models. Compared with the first calculation model, the quantum well in the variable resistance layer 44 is widely formed. A lowest energy level formed in the quantum well becomes low. The count of the energy levels formed in the quantum well is also increased.

The third calculation calculates only the direct tunneling current. Therefore, this method does not accommodate the TAT current.

As illustrated in FIG. 22, with the first calculation model whose film thickness of the variable resistance layer 44 is 1 nm, similar to the case described with reference to FIG. 18, the cell current Icell became the local maximal value when the voltage V reached around −4.0 V and around −5.7 V.

As illustrated in FIG. 22, with the fourth calculation model whose film thickness of the variable resistance layer 44 is 1.4 nm, when the voltage V reached around −3.7 V, the cell current Icell became the local maximal value. When the voltage V reached around −4.2 V, the cell current Icell became the local minimal value. When the voltage V reached around −5.0 V, the cell current Icell became the local maximal value. When the voltage V reached around −5.6 V, the cell current Icell became the local minimal value. Afterwards, in association with the reduction in voltage (the increase in the magnitude of the voltage), the cell current Icell increased.

As illustrated in FIG. 22, with the fifth calculation model whose film thickness of the variable resistance layer 44 is 2.0 nm, when the voltage V reached around −3.4 V, the cell current Icell became the local maximal value. When the voltage V reached around −3.8 V, the cell current Icell became the local minimal value. When the voltage V reached around −4.4 V, the cell current Icell became the local maximal value. When the voltage V reached around −4.8 V, the cell current Icell became the local minimal value. Further, when the voltage V reached around −5.6 V, the cell current Icell became the local maximal value. When the voltage V reached around −6.4 V, the cell current Icell became the local minimal value. Afterwards, in association with the reduction in voltage (the increase in the magnitude of the voltage), the cell current Icell increased.

As illustrated in FIG. 22, with the sixth calculation model whose film thickness of the variable resistance layer 44 is 2.5 nm, when the voltage V reached around −3.3 V, the cell current Icell became the local maximal value. When the voltage V reached around −3.6 V, the cell current Icell became the local minimal value. When the voltage V reached around −4.2 V, the cell current Icell became the local maximal value. When the voltage V reached around −4.5 V, the cell current Icell became the local minimal value. Further, when the voltage V reached around −5.2 V, the cell current Icell became the local maximal value. When the voltage V reached around −5.6 V, the cell current Icell became the local minimal value. Afterwards, in association with the reduction in voltage (the increase in the magnitude of the voltage), the cell current Icell increased.

Figure 23:
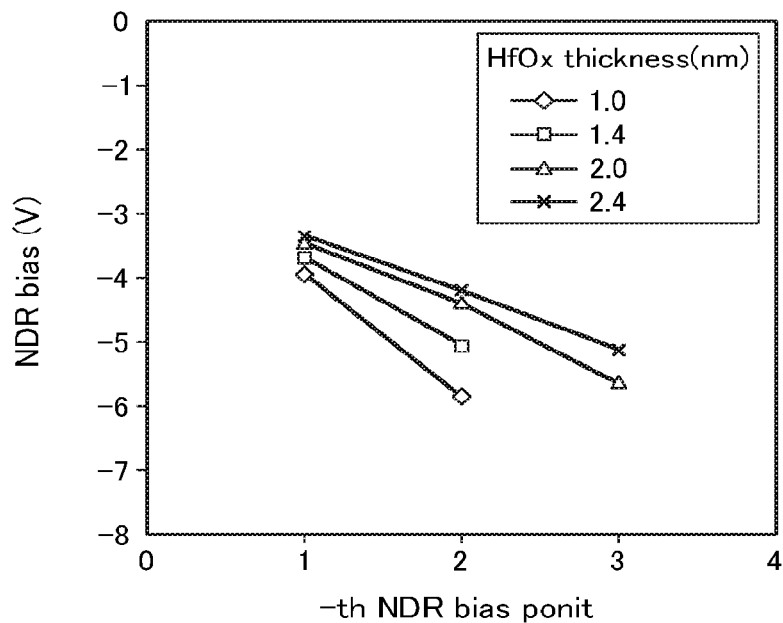
FIG. 23 is a graph of the current-voltage characteristics showing results of the third calculation.

FIG. 23 summarizes the differential negative resistance bias points at the time of the results of the calculations described with reference to FIG. 22. In FIG. 23, different lines indicate the properties of the different calculation models (varied in the film thickness of the variable resistance layer 44) described in FIG. 22. In FIG. 23, different points indicate the differential negative resistance bias points in the respective calculation models. The horizontal axis indicates the order of appearance of the local maximal value with the predetermined calculation models. The NDR represents the capital letters of Negative Differential Resistance. The vertical axis indicates the voltage V (the differential negative resistance bias point) at the local maximal value. Thus, FIG. 23 is a graph showing what number of the differential negative resistance bias point (the horizontal axis) counted from each zero bias is what magnitude of V (the vertical axis) in the Icell-V characteristics in FIG. 22. That is, with all the first calculation model and the fourth to sixth calculation models where the configuration including the variable resistance layer 44 and the barrier layers 45 and 46, which are formed on both side surfaces of the variable resistance layer 44 and have smaller electron affinity than that of the variable resistance layer 44, is assumed, the differential negative resistance of equal to or more than once was observed. Accordingly, it is considered that in the case where the film thickness of the variable resistance layer 44 is at least in the range of 1 nm to 2.5 nm, the differential negative resistance occurs while adjusting the applied voltage from −7 V to 0 V.

As illustrated in FIG. 22 and FIG. 23, with the first calculation model and the fourth to sixth calculation models, the larger the film thickness of the variable resistance layer 44, the smaller the voltage V at which the differential negative resistance occurred. With the fifth and sixth calculation models whose film thickness of the variable resistance layer 44 is comparatively large, not only the two energy levels but also the third energy level was observed. This suggests that preferably adjusting the film thickness of the variable resistance layer 44 allows adjusting the voltage at which the differential negative resistance occurs and the count of occurrences of the differential negative resistance.

[Second Embodiment]

Figure 24:
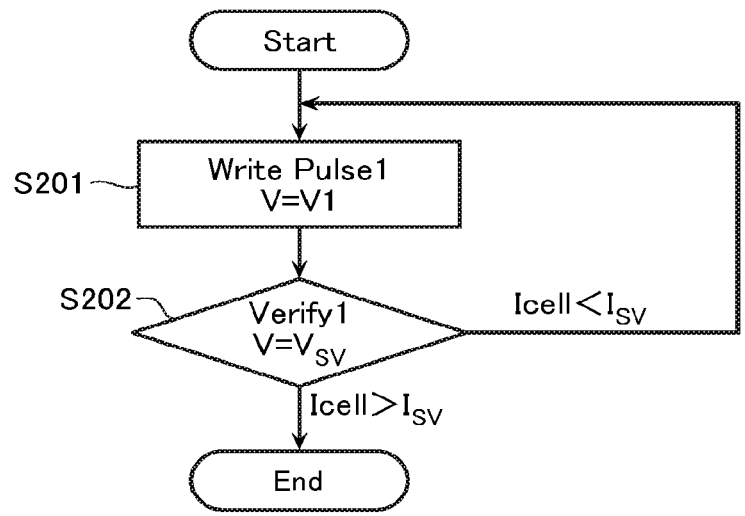
FIG. 24 is a flowchart for describing a method of a setting operating according to a second embodiment.

The following describes the second embodiment with reference to FIG. 24. The semiconductor memory device according to the second embodiment is configured basically similar to the semiconductor memory device according to the first embodiment. However, the second embodiment differs from the first embodiment in the method for setting operation. Like reference numerals designate corresponding or identical elements throughout the first embodiment, and therefore such elements will not be further elaborated here.

FIG. 24 is a flowchart for describing a method of the setting operating according to a second embodiment. As illustrated in FIG. 24, the setting operation according to the embodiment repeatedly performs the voltage applying step S201 and the verification step S202. At the voltage applying step S201, the voltage V applied between the bit line BL and the word line WL is fixed at the predetermined write voltage V1. This write voltage V1 is fixed at the voltage in range of generating the above-described differential negative resistance. At the point when the cell current Icell reaches the threshold current $I_{SV}$, the setting operation is terminated.

With the semiconductor memory device according to the embodiment, similar to the first embodiment, the quantum well restricts the tunneling current. Accordingly, the phenomenon as described with reference to FIG. 14 can be restrained. The semiconductor memory device according to the embodiment can generate the comparatively large electric field in the variable resistance layer 44 while preventing the Joule heat caused by the tunneling current, ensuring preferably controlling the resistance value of the variable resistive element VR.

[Other Embodiments]

Figure 25:
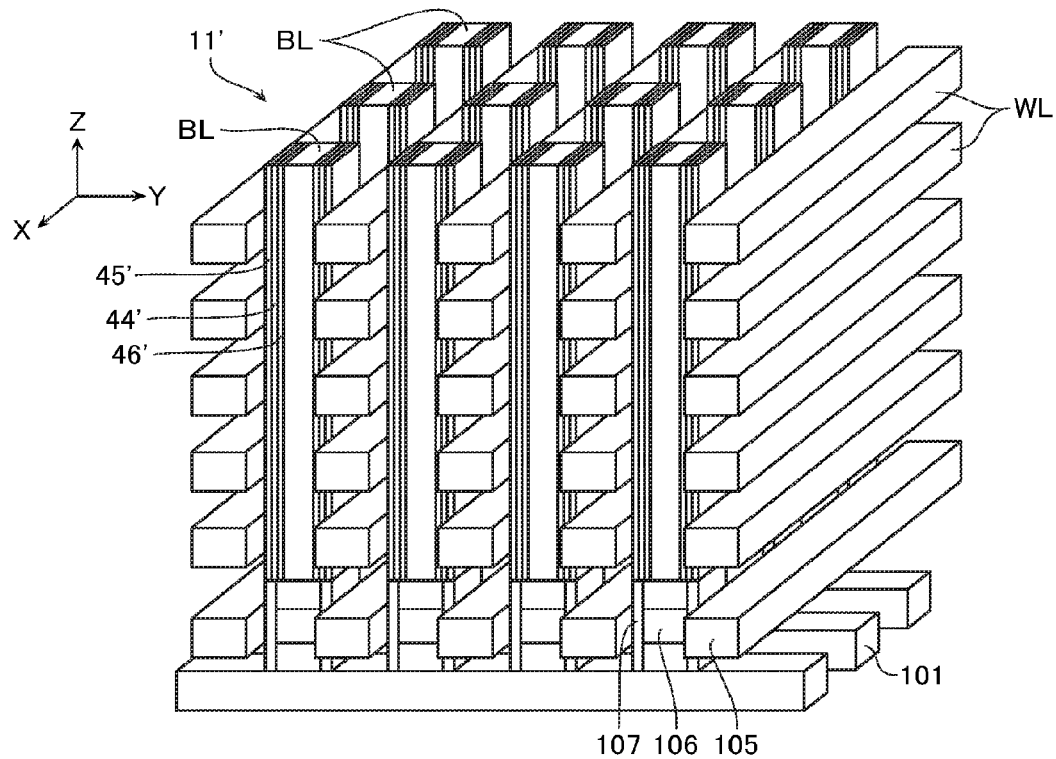
FIG. 25 is an exemplary perspective view illustrating a laminated structure of a memory cell array according to another embodiment.

As described with reference to FIG. 3, in the first and second embodiments, the variable resistance layer 44 expands in a planar shape along a plane formed between the plurality of bit lines BL, which are disposed in the X direction, and the plurality of word lines WL, which are disposed in the Z direction. However, as illustrated in FIG. 25, variable resistance layers 44' may be separated in the X direction along the side surfaces of the bit line BL in the X direction. In this case, for example, first barrier insulating layers 45' and second barrier insulating layers 46' may also be separated in the X direction along the side surfaces of the bit line BL. The first barrier insulating layers 45' may be separated in the Z direction along the side surfaces of the word line WL in the Z direction.

Figure 26:
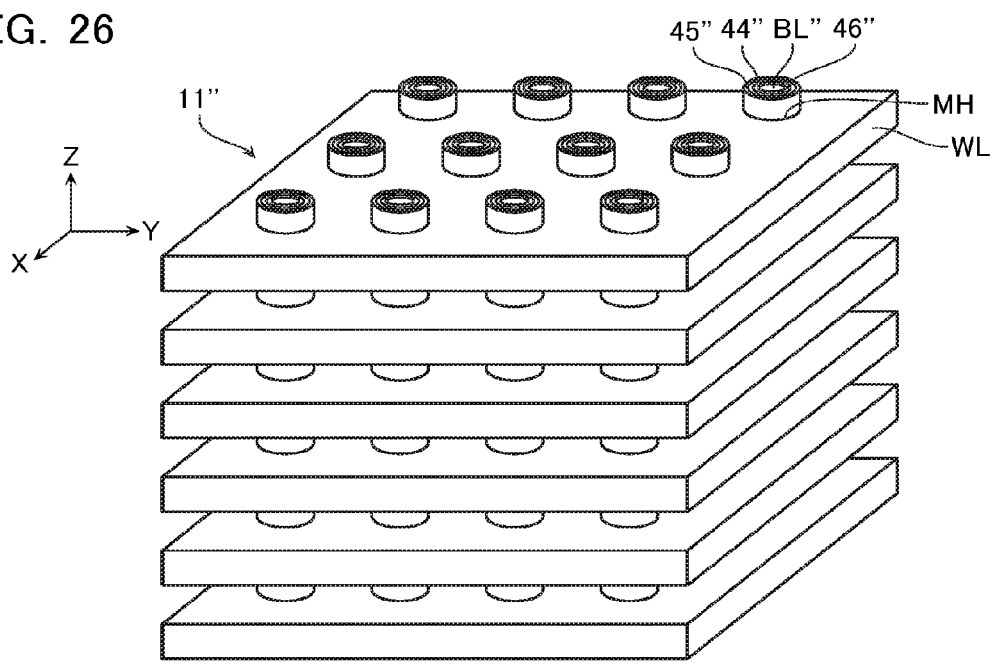
FIG. 26 is an exemplary perspective view illustrating a laminated structure of a memory cell array according to another embodiment.

As described with reference to FIG. 3, in the first and second embodiments, the word lines WL were separated in the X direction and were opposed to the bit lines BL by both side surfaces in the X direction. However, as illustrated in FIG. 26, the word lines WL may be formed into a flat plate shape expanding in the X-Y plane. A plurality of memory holes MH may be bored. Bit lines BL" each having a column shape may be formed in the memory holes MH. In this case, as illustrated in FIG. 26, the following is considered. A first barrier insulating layer 45" is formed at the outermost periphery of this memory hole MH. A variable resistance layer 44" is formed inside of the first barrier insulating layer 45". A second barrier insulating layer 46" is formed inside the variable resistance layer 44". Further, the bit line BL" is formed inside the second barrier insulating layer 46".

As described with reference to FIG. 3, in the first and second embodiments, the variable resistance layer 44 expands in a planar shape along a plane formed between the plurality of bit lines BL, which are disposed in the X direction, and the plurality of word lines WL, which are disposed in the Z direction.

Figure 27:
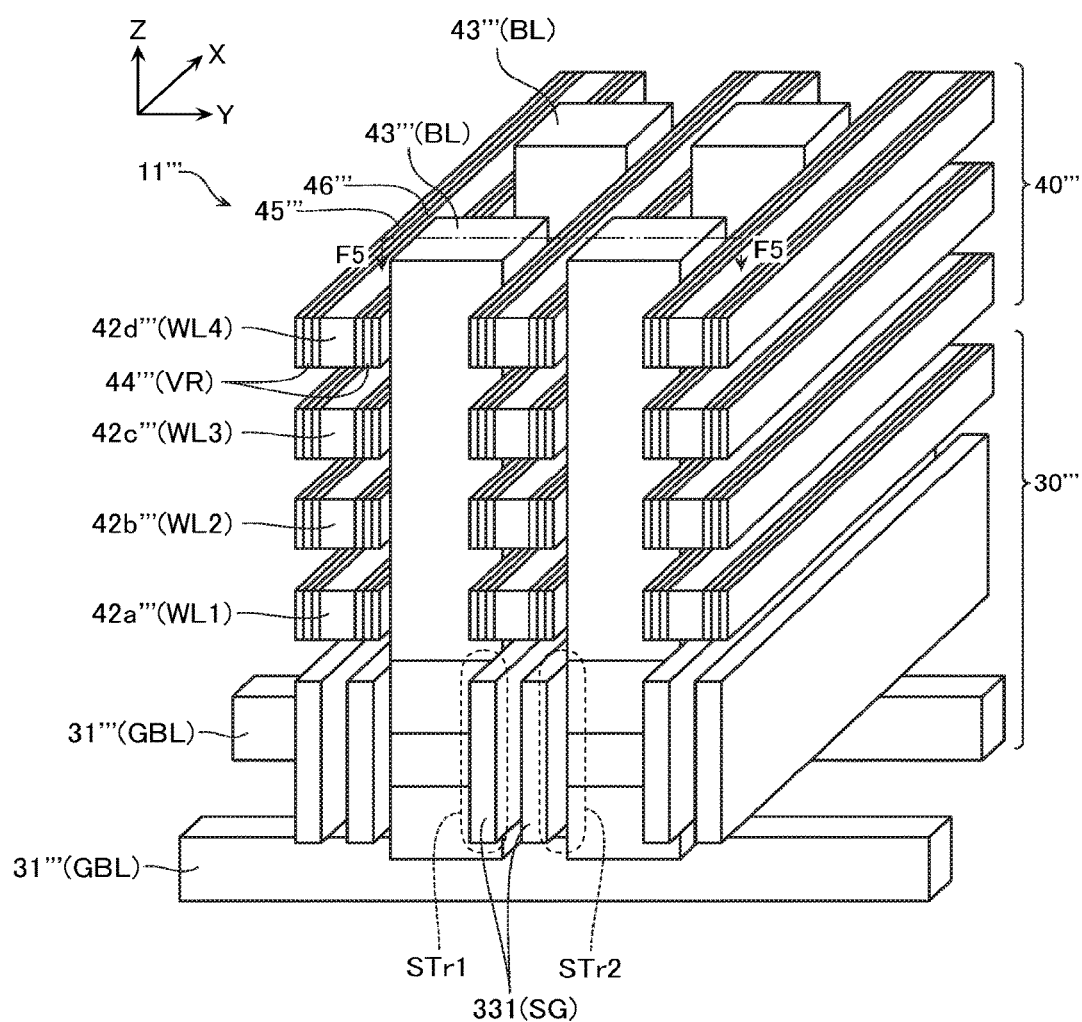
FIG. 27 is an exemplary perspective view illustrating a laminated structure of a memory cell array according to another embodiment.

However, as illustrated in FIG. 27, which is an exemplary perspective view illustrating a laminated structure of the memory cell array 11''' for this embodiment, variable resistance layers 44''' are separated in the Z direction along the side surfaces of the word line WL in the X direction. Here, first barrier insulating layers 45''' and second barrier insulating layers 46''' also be separated in the Z direction along the side surfaces of the word line WL.

As described with reference to FIG. 3, in the first embodiment, the conducting layers 33 function as the gates of the selection gate line SG and the selection transistor STr. In the first embodiment, one selection gate line SG is a common gate for two selection transistors STr.

Figure 28:
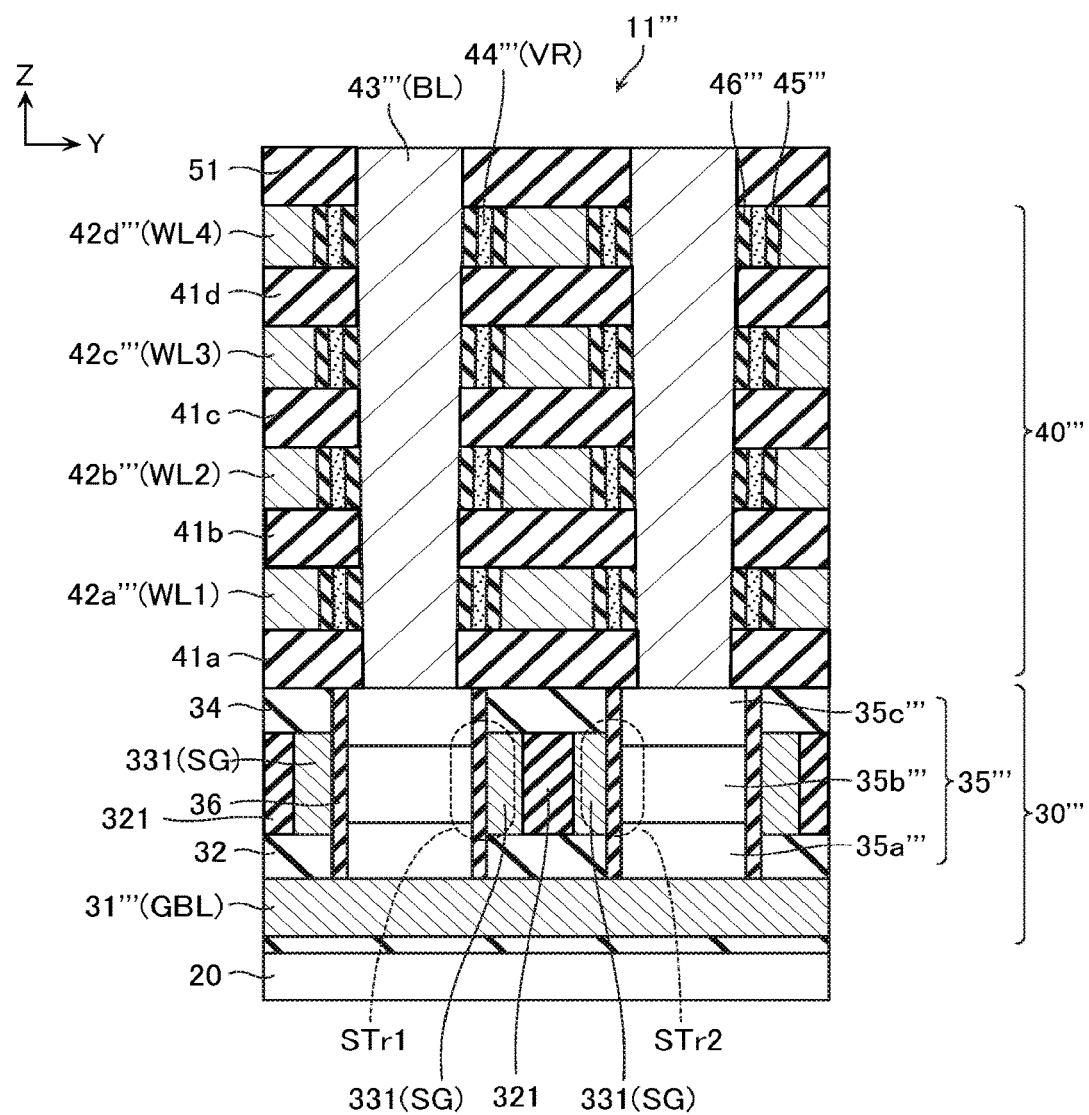
FIG. 28 is an exemplary cross-sectional view viewed from the X direction in FIG. 27.

However, as illustrated in FIG. 27 and FIG. 28, which is an exemplary cross-sectional view taken along the F5-F5 plane in FIG. 27, the conducting layers 331 (SG) are separated in the Y direction along the side surfaces of the insulating layers 321, which are shown only in FIG. 28, in the X direction. This selection gate 331(SG) separation enables independent drive of the selection transistors STr1 and STr2.

As described with reference to FIG. 5 and FIG. 6, in the first embodiment, when the voltage V reached the compliance voltage Vcomp, the setting operation was halted. However, in this case, for example, until the cell current Icell reaches the threshold current $I_{SV}$, as the write voltage, the compliance voltage Vcomp can also be kept to be applied.

Further, it the case where the electric field where the resistance value decreases (the oxygen ion $O^{2-}$ moves), which is as described with reference to FIG. 9, is roughly guessed, the following is possible. The materials of the variable resistance layer 44 and the first and second barrier insulating layers 45 and 46 are selected to cause the differential negative resistance to occur in the range of the voltage in which such electric field occurs in the variable resistance layer 44. The film thicknesses of the variable resistance layer 44 and the first and second barrier insulating layers 45 and 46 are adjusted. As described with reference to FIG. 5, to gradually increase the write voltage in the setting operation, it is also considered that the magnitude of the compliance voltage Vcomp is set in the range of the voltage at which the differential negative resistance occurs. As described with reference to FIG. 24, to fix the magnitude of the write voltage to a constant value, it is also considered that the magnitude of this write voltage is set in the range of the voltage at which the differential negative resistance occurs. In both cases, it is considered that the magnitude (the absolute value) of the set verification voltage $V_{SV}$ is set outside the range of the voltage at which such differential negative resistance occurs and in the range smaller than the smallest voltage value in such range.

In the respective embodiments, the energy barriers of the first barrier insulating layer 45 and the second barrier insulating layer 46 against the electrons and the holes were larger than the energy barrier of the variable resistance layer 44 against the electrons and the holes. However, for example, in the case where the current flowing through the variable resistance layer 44 is mainly an electronic current, only the energy barriers of the first barrier insulating layer 45 and the second barrier insulating layer 46 against the electrons may be larger than the energy barrier of the variable resistance layer 44 against the electrons. Similarly, for example, in the case where the current flowing through the variable resistance layer 44 is mainly a Hall current, only the energy barriers of the first barrier insulating layer 45 and the second barrier insulating layer 46 against the holes may be larger than the energy barrier of the variable resistance layer 44 against the holes.

[Others

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor memory device comprising:
a plurality of first wirings disposed at predetermined pitches in a first direction intersecting with a substrate;
a plurality of second wirings disposed at predetermined pitches in a second direction intersecting with the first direction, the second wirings being formed to extend in the first direction;
a variable resistance layer disposed between a first wiring and a second wiring, the variable resistance layer being disposed at a position where the first wiring intersects with the second wiring;
a first barrier insulating layer disposed between the first wiring and the variable resistance layer; and
a second barrier insulating layer disposed between the second wiring and the variable resistance layer,
the first barrier insulating layer and the second barrier insulating layer having at least one of
electron affinities smaller than an electron affinity of the variable resistance layer, and a sum of electron affinities and energy gaps greater than a sum of an electron affinity and an energy gap of the variable resistance layer.

2. The semiconductor memory device according to claim 1, wherein
the variable resistance layer has a film thickness equal to or more than one atomic layer to 3 nm or less.

3. The semiconductor memory device according to claim 1, wherein
the first barrier insulating layer has a film thickness equal to 1 nm or less, and
the second barrier insulating layer has a film thickness equal to 1 nm or less.

4. The semiconductor memory device according to claim 2, wherein
the first barrier insulating layer has a film thickness equal to 1 nm or less, and
the second barrier insulating layer has a film thickness equal to 1 nm or less.

5. The semiconductor memory device according to claim 1, wherein
the variable resistance layer contains at least one of a transition metal oxide, gallium oxide, and InGaZnO.

6. The semiconductor memory device according to claim 4, wherein
the variable resistance layer contains at least one of a transition metal oxide, gallium oxide, and InGaZnO.

7. The semiconductor memory device according to claim 5, wherein
the variable resistance layer contains $HfO_x$, and
the first barrier insulating layer and the second barrier insulating layer contain at least one of $SiO_2$, SiON, $Al_2O_3$, or $Si_3N_4$.

8. The semiconductor memory device according to claim 6, wherein
the variable resistance layer contains $HfO_x$, and
the first barrier insulating layer and the second barrier insulating layer contain at least one of $SiO_2$, SiON, $Al_2O_3$, or $Si_3N_4$.

9. The semiconductor memory device according to claim 1, wherein
the first barrier insulating layer and the second barrier insulating layer have electron affinities smaller than an electron affinity of the variable resistance layer.

10. The semiconductor memory device according to claim 9, wherein
assuming that a difference between the electron affinity of the variable resistance layer and the electron affinity of the first barrier insulating layer as $\Delta_{\chi 1}$, a difference between the electron affinity of the variable resistance layer and the electron affinity of the second barrier insulating layer as $\Delta_{\chi 2}$, the film thickness of the variable resistance layer as T, an effective mass of an electron in a conduction band of the variable resistance layer as m, and a Planck constant as h, formula (1) and formula (2) as follows:

$$\frac{h^2}{8mT^2} < \Delta\chi_1 \text{ and} \qquad \text{Formula (1)}$$

$$\frac{h^2}{8mT^2} < \Delta\chi_2 \qquad \text{Formula (2)}$$

are met.

11. The semiconductor memory device according to claim 1, wherein
a sum of electron affinities and energy gaps of the first barrier insulating layer and the second barrier insulating layer is greater than a sum of an electron affinity and an energy gap of the variable resistance layer.

12. The semiconductor memory device according to claim 11, wherein
assuming that the energy gap of the variable resistance layer as $E_g$, the electron affinity of the variable resistance layer as $\chi$, the energy gap of the first barrier insulating layer as $E_{g1}$, the electron affinity of the first barrier insulating layer as $\chi 1$, the energy gap of the second barrier insulating layer as $E_{g2}$, the electron affinity of the second barrier insulating layer as $\chi 2$, the film thickness of the variable resistance layer as T, an effective mass of a hole in a valence band of the variable resistance layer as m, and a Planck constant as h, formula (3) and formula (4) as follows:

$$\frac{h^2}{8mT^2} < (\chi_1 + E_{g1}) - (\chi + E_g) \text{ and} \qquad \text{Formula (3)}$$

$$\frac{h^2}{8mT^2} < (\chi_2 + E_{g2}) - (\chi + E_g) \qquad \text{Formula (4)}$$

are met.

13. The semiconductor memory device according to claim 1, wherein
an application of a voltage between the first wiring and the second wiring generates a differential negative resistance in which a current decreases in association with an increase in voltage.

14. The semiconductor memory device according to claim 13, further comprising
a control circuit coupled to the first wiring and the second wiring, wherein
a resistance value of the variable resistance layer is transitional between a low resistance state and a high resistance state,
the control circuit applies a voltage between the first wiring and the second wiring in a setting operation, the setting operation being configured to cause the variable resistance layer to transition from the high resistance state to the low resistance state, and
a maximum value of the voltage applied between the first wiring and the second wiring is set in a range where the differential negative resistance occurs.

15. The semiconductor memory device according to claim 14, wherein
in the setting operation, the control circuit is configured to apply a first voltage and a second voltage in alternation between the first wiring and the second wiring, the second voltage being smaller than the first voltage, and
an absolute value of the second voltage is set outside the range where the differential negative resistance occurs and within a range smaller than an absolute value of a minimum voltage value at which the differential negative resistance occurs.

16. A method of controlling a semiconductor memory device, wherein the semiconductor memory device includes:
a plurality of first wirings disposed at predetermined pitches in a first direction intersecting with a substrate;
a plurality of second wirings disposed at predetermined pitches in a second direction intersecting with the first direction, the second wirings being formed to extend in the first direction;

a variable resistance layer disposed between a first wiring and a second wiring, the variable resistance layer being disposed at a position where the first wiring intersects with the second wiring;

a first barrier insulating layer disposed between the first wiring and the variable resistance layer; and a second barrier insulating layer disposed between the second wiring and the variable resistance layer, wherein a resistance value of the variable resistance layer is transitional between a low resistance state and a high resistance state, an application of a voltage between the first wiring and the second wiring generates a differential negative resistance in which a current decreases in association with an increase in voltage, wherein the method of controlling the semiconductor memory device comprising:

applying a voltage between the first wiring and the second wiring in a setting operation configured to cause the variable resistance layer to transition from the high resistance state to the low resistance state, and a maximum value of the voltage applied between the first wiring and the second wiring is set in a range where the differential negative resistance occurs.

17. The method of controlling the semiconductor memory device according to claim 16, wherein the setting operation is configured to apply a first voltage and a second voltage in alternation between the first wiring and the second wiring, the second voltage being smaller than the first voltage, and an absolute value of the second voltage is set outside the range where the differential negative resistance occurs and within a range smaller than an absolute value of a minimum voltage value at which the differential negative resistance occurs.

* * * * *